US012648372B2

(12) United States Patent
Chang et al.

(10) Patent No.: US 12,648,372 B2
(45) Date of Patent: Jun. 2, 2026

(54) CAPACITOR CIRCUIT PROVIDING SELF-ADJUSTING CAPACITANCE AND METHODS FOR FORMING THE SAME

(71) Applicant: Taiwan Semiconductor Manufacturing Company Limited, Hsinchu (TW)

(72) Inventors: Kuo-Pin Chang, Zhubei city (TW); Yu-Wei Ting, Taipei City (TW); Kuo-Ching Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 394 days.

(21) Appl. No.: 18/317,120

(22) Filed: May 15, 2023

(65) Prior Publication Data

US 2024/0389486 A1 Nov. 21, 2024

(51) Int. Cl.
*H10N 79/00* (2026.01)
*H10B 53/20* (2023.01)
*H10D 1/68* (2025.01)

(52) U.S. Cl.
CPC ............. *H10N 79/00* (2023.02); *H10B 53/20* (2023.02); *H10D 1/68* (2025.01)

(58) Field of Classification Search
CPC ........ H10B 53/00; H10B 53/30; H10B 53/40; H10B 53/20; H10B 12/30; H10B 12/00; H10B 12/31; H10B 63/00; H10B 63/30; H10B 63/32; H10B 63/80; H10B 63/82; H10B 63/84; H10B 80/00; H10D 1/68; H10D 1/682; H10D 1/60; H10D 1/66;
(Continued)

(56) References Cited

U.S. PATENT DOCUMENTS 5,792,697 A * 8/1998 Wen ...................... H10B 20/363
257/E27.102
6,391,707 B1 * 5/2002 Dirnecker .............. H10D 1/692
257/E21.018
(Continued)

OTHER PUBLICATIONS

Jianq Chyun Intellectual Property Office; TW Application No. 112125692; Office Action mailed Jun. 20, 2024; 10 pages.

*Primary Examiner* — Sophia T Nguyen
(74) *Attorney, Agent, or Firm* — The Marbury Law Group, PLLC

(57) ABSTRACT

A device structure includes a parallel connection of capacitor-switch assemblies located over a substrate. The capacitor-switch assemblies include a first capacitor-switch assembly that includes a first series connection of a first capacitor and a first non-Ohmic switching device, which has a first threshold voltage and includes a first primary switch electrode, a first secondary switch electrode, and a first non-Ohmic switching material portion. The capacitor switch assemblies further include a second capacitor-switch assembly that includes a second series connection of a second capacitor and a second non-Ohmic switching device, which has a second threshold voltage and includes a second primary switch electrode, a second secondary switch electrode, and a second non-Ohmic switching material portion. The second threshold voltage is different from the first threshold voltage. The non-Ohmic switching devices may be conditionally turned on depending on a magnitude of applied voltage spikes.

20 Claims, 22 Drawing Sheets

(58) Field of Classification Search

CPC ............ H10D 1/64; H10D 1/62; H10D 88/00; H10D 89/10; H01L 23/5223; H01L 2924/00; H01L 2924/0002

See application file for complete search history.

(56)                  References Cited

U.S. PATENT DOCUMENTS

| | | | | |
|---|---|---|---|---|
| 6,656,748 | B2 * | 12/2003 | Hall ....................... | H10B 53/30 257/E21.664 |
| 6,710,425 | B2 * | 3/2004 | Bothra ................ | H01L 23/5223 257/532 |
| 6,730,950 | B1 * | 5/2004 | Seshadri ................ | H10B 53/30 257/532 |
| 6,803,641 | B2 * | 10/2004 | Papa Rao ............ | H10D 84/212 257/532 |
| 6,830,938 | B1 * | 12/2004 | Rodriguez ............. | H10D 1/682 438/18 |
| 6,919,233 | B2 * | 7/2005 | Papa Rao ............ | H10D 84/212 257/E27.048 |
| 7,009,235 | B2 * | 3/2006 | Rinerson ................ | H10B 53/00 438/257 |
| 7,561,458 | B2 * | 7/2009 | Madan .................... | G11C 11/22 365/158 |
| 7,663,241 | B2 * | 2/2010 | Fujimaki ................ | H10D 1/716 257/532 |
| 7,795,657 | B2 * | 9/2010 | Hidaka .................. | H10B 53/00 257/295 |
| 8,115,258 | B2 * | 2/2012 | Shim ..................... | H10B 69/00 257/E27.044 |
| 8,551,856 | B2 * | 10/2013 | Rennie ................... | H10D 1/716 257/532 |
| 8,604,586 | B2 * | 12/2013 | Kang ....................... | H10D 1/68 257/532 |
| 8,753,952 | B2 * | 6/2014 | Summerfelt ............. | H10D 1/62 257/532 |
| 8,824,189 | B2 * | 9/2014 | Kobatake ............... | H10B 63/80 365/158 |
| 9,035,276 | B2 * | 5/2015 | Herner ................... | H10B 63/84 438/102 |
| 9,601,545 | B1 * | 3/2017 | Tu ........................... | H10B 63/80 |
| 11,296,099 | B2 * | 4/2022 | Chen ..................... | H10B 53/10 |
| 11,527,542 | B2 * | 12/2022 | Yeong .................... | H10B 12/31 |
| 2002/0167348 | A1 * | 11/2002 | Kim ......................... | G11C 5/005 327/310 |
| 2002/0173111 | A1 * | 11/2002 | Kasai ...................... | H10B 53/40 257/E21.664 |
| 2004/0126981 | A1 * | 7/2004 | Rao ....................... | H10D 84/212 29/25.03 |
| 2004/0235245 | A1 * | 11/2004 | Summerfelt ........... | H10B 53/30 438/257 |
| 2004/0245547 | A1 | 12/2004 | Stipe | |
| 2004/0262635 | A1 | 12/2004 | Lee | |
| 2006/0073616 | A1 * | 4/2006 | Ohashi ................... | H10D 1/696 257/E21.664 |
| 2006/0266990 | A1 * | 11/2006 | Wicker ................ | H10N 70/823 257/E21.582 |
| 2007/0008767 | A1 * | 1/2007 | Murakami ............. | H10D 89/10 257/295 |
| 2007/0120105 | A1 * | 5/2007 | Chao .................. | H10N 70/8828 257/3 |
| 2008/0165566 | A1 * | 7/2008 | Park ................... | G11C 13/0069 365/189.16 |
| 2008/0191188 | A1 * | 8/2008 | Jeong .................... | H10B 63/30 257/E27.071 |
| 2008/0308902 | A1 * | 12/2008 | Kumura ................. | H10D 1/688 257/532 |
| 2010/0027318 | A1 * | 2/2010 | Nagashima ........ | G11C 13/0007 365/189.011 |
| 2010/0065944 | A1 * | 3/2010 | Tu .......................... | H10B 12/09 257/532 |
| 2010/0252894 | A1 * | 10/2010 | Shim ...................... | H10B 41/00 257/314 |
| 2010/0308882 | A1 * | 12/2010 | Liu ........................ | H03K 5/131 327/283 |
| 2010/0330761 | A1 * | 12/2010 | Oh ......................... | H10B 69/00 257/E21.423 |
| 2011/0128772 | A1 * | 6/2011 | Kim ................... | G11C 13/0069 365/230.06 |
| 2011/0234433 | A1 * | 9/2011 | Aruga ................... | H10D 1/714 341/172 |
| 2011/0253965 | A1 * | 10/2011 | Liu ........................ | H10B 63/34 257/E45.001 |
| 2013/0062733 | A1 * | 3/2013 | Summerfelt ........... | H10B 53/30 257/532 |
| 2013/0208529 | A1 * | 8/2013 | Tomotani .............. | G11C 29/76 365/148 |
| 2013/0230963 | A1 * | 9/2013 | Kim ........................ | H10D 8/00 438/396 |
| 2014/0367831 | A1 * | 12/2014 | Yen ........................ | H10D 1/025 257/595 |
| 2015/0221657 | A1 * | 8/2015 | Sashida .................. | H10B 53/30 532 |
| 2015/0349024 | A1 * | 12/2015 | Huang ................. | H10N 70/826 257/4 |
| 2016/0093627 | A1 * | 3/2016 | Sashida ................. | H01L 23/585 257/532 |
| 2016/0141003 | A1 * | 5/2016 | Saitoh .................... | H10B 63/34 365/226 |
| 2016/0254822 | A1 * | 9/2016 | Sugawara ............. | H10D 89/10 341/150 |
| 2016/0284713 | A1 * | 9/2016 | Kihara .................. | G11C 11/412 |
| 2016/0300883 | A1 * | 10/2016 | Bateman ............. | H10B 63/845 |
| 2017/0018550 | A1 * | 1/2017 | Shih ...................... | H10D 1/692 |
| 2017/0243918 | A1 * | 8/2017 | Terai .................. | H10N 70/8413 |
| 2017/0294483 | A1 * | 10/2017 | Terai ...................... | H10D 88/00 |
| 2018/0082729 | A1 * | 3/2018 | Slesazeck ............ | H10D 64/691 |
| 2019/0221261 | A1 * | 7/2019 | Ge ........................ | H10B 63/30 |
| 2020/0082880 | A1 * | 3/2020 | Inuzuka ............... | G11C 13/003 |
| 2020/0083160 | A1 * | 3/2020 | El-Hinnawy ...... | H10N 70/8825 |
| 2020/0328220 | A1 * | 10/2020 | Derner .................. | G11C 11/221 |
| 2020/0357927 | A1 * | 11/2020 | Hsieh ................... | H10D 64/689 |
| 2021/0143071 | A1 * | 5/2021 | Lan ....................... | H01L 24/94 |
| 2021/0193663 | A1 * | 6/2021 | Sharma ............. | H10N 70/8828 |
| 2021/0265355 | A1 * | 8/2021 | Sharma ............. | H10N 70/8836 |
| 2021/0327888 | A1 * | 10/2021 | Wang ................. | H01L 23/5223 |
| 2021/0376055 | A1 * | 12/2021 | Lu ........................... | H10D 1/68 |
| 2021/0391003 | A1 * | 12/2021 | Chiang ............... | G11C 11/5628 |
| 2022/0140796 | A1 * | 5/2022 | Chang ................. | H03F 3/45475 330/252 |
| 2022/0285263 | A1 * | 9/2022 | Lo ........................... | H10D 1/68 |
| 2022/0359550 | A1 | 11/2022 | Yeong et al. | |
| 2023/0106886 | A1 * | 4/2023 | Miyakawa ............. | H10N 50/80 365/158 |
| 2023/0284456 | A1 * | 9/2023 | Dokania ............... | H10B 53/50 257/5 |
| 2023/0387186 | A1 * | 11/2023 | Lu ........................ | H10D 1/682 |
| 2024/0389486 | A1 * | 11/2024 | Chang ................... | H10B 63/80 |

\* cited by examiner

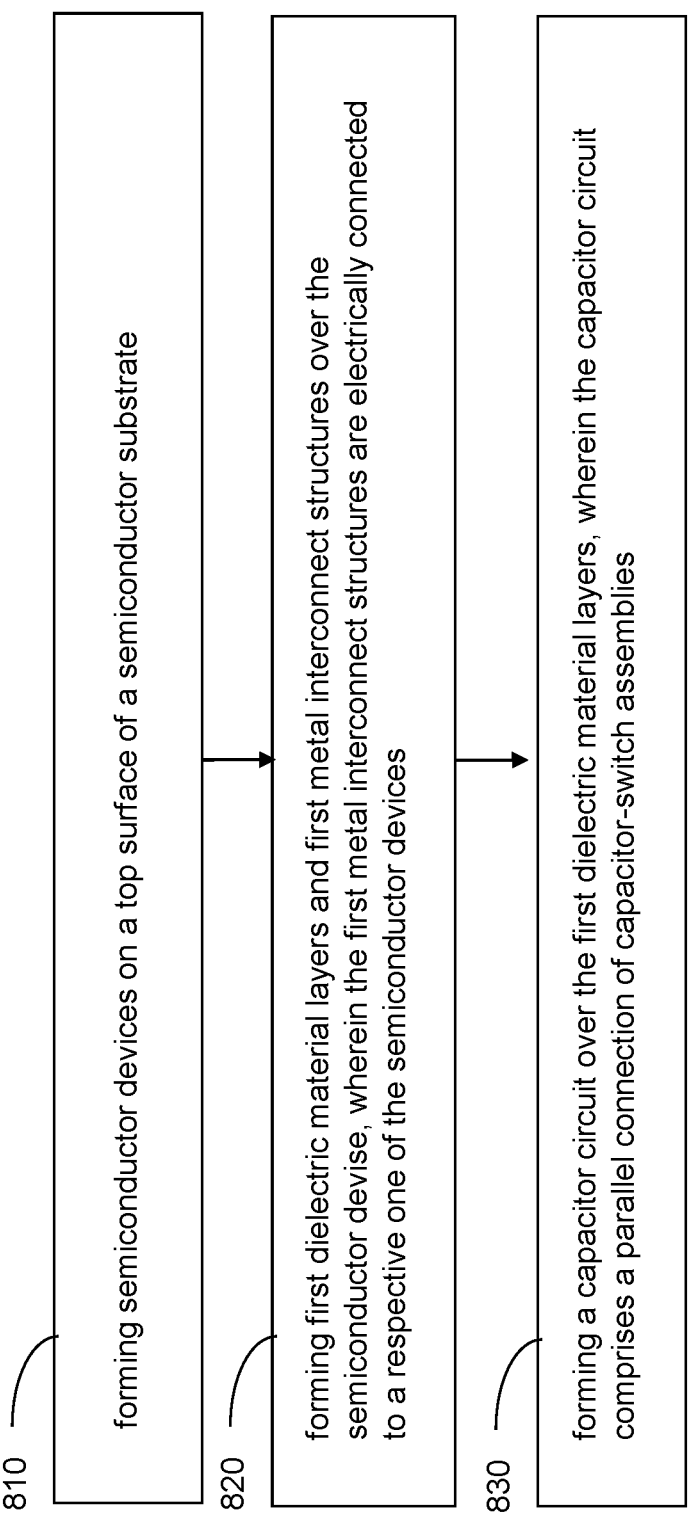

810 — forming semiconductor devices on a top surface of a semiconductor substrate 820 — forming first dielectric material layers and first metal interconnect structures over the semiconductor devise, wherein the first metal interconnect structures are electrically connected to a respective one of the semiconductor devices 830 — forming a capacitor circuit over the first dielectric material layers, wherein the capacitor circuit comprises a parallel connection of capacitor-switch assemblies

FIG. 8

CAPACITOR CIRCUIT PROVIDING SELF-ADJUSTING CAPACITANCE AND METHODS FOR FORMING THE SAME

BACKGROUND

Decoupling capacitors are used to optimize performance of some semiconductor circuits. Generally, an optimal value for the decoupling capacitance provides the best performance of such semiconductor circuits. While large capacitance tends to provide some leeway for variations in device performance of semiconductor devices in semiconductor circuits, an excessively large capacitance may degrade device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flowchart that illustrates general processing steps for manufacturing a device structure according to an embodiment of the present disclosure.

DETAILED DESCRIPTION

Figure 1:
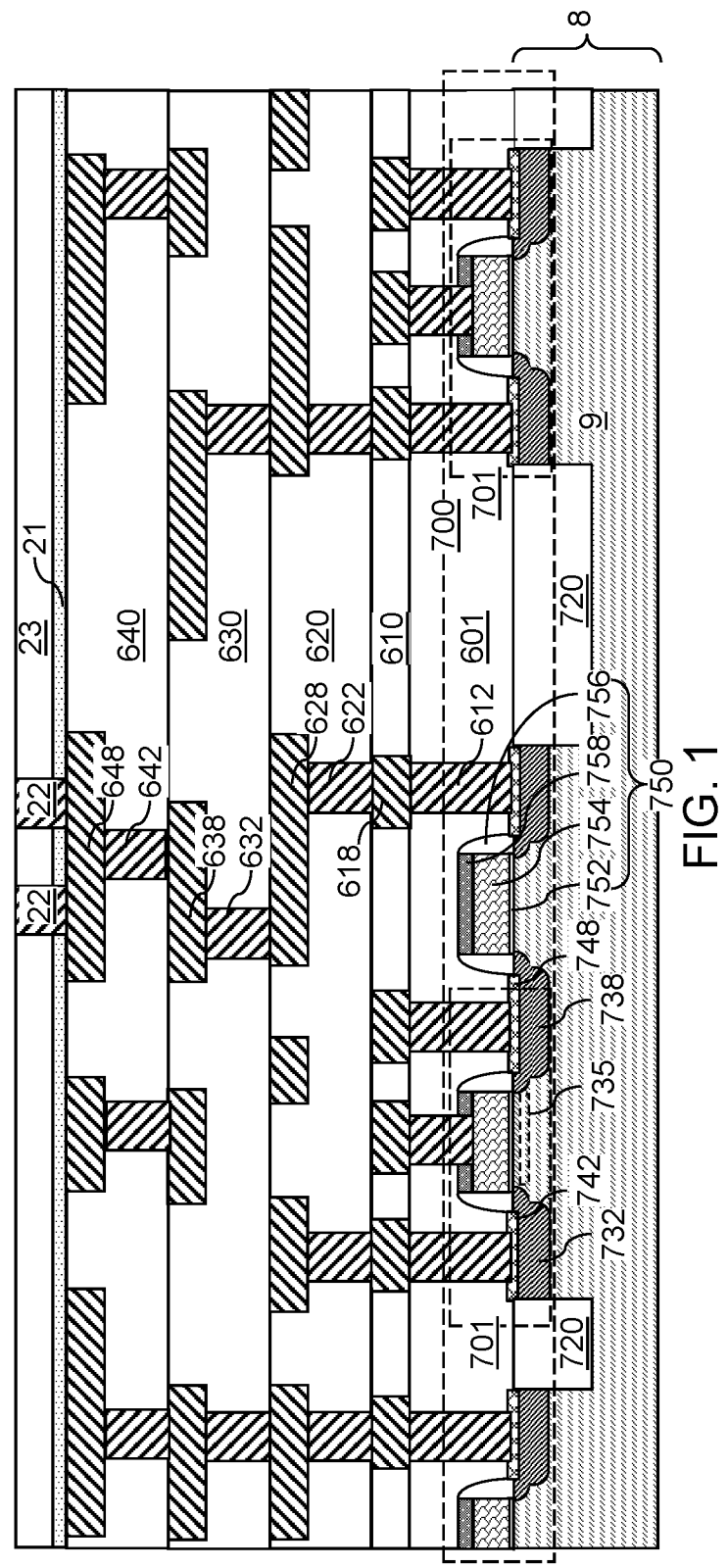
FIG. 1 is a vertical cross-sectional view of a first structure after formation of complementary metal-oxide-semiconductor (CMOS) transistors, metal interconnect structures and dielectric material layers, an optional dielectric capping layer, and a bottom-via-level dielectric layer according to an embodiment of the present disclosure.

The following disclosure provides many different embodiments, or examples, for implementing different fea-
tures of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Embodiments of the present disclosure are directed to a capacitor circuit providing self-adjusting capacitance and methods for forming the same. An optimal value is preferred for the capacitance of a decoupling capacitor in order to provide an optimal level of decoupling capacitance. Excessively large values or small values for the decoupling capacitance may adversely impact performance of a semiconductor circuit. Inherent wafer-to-wafer variations and within-wafer variations of process parameters for a capacitor circuit may lead to variations in the decoupling capacitance. Such process parameters may include, but are not limited to, thicknesses and material compositions of various films used to form a decoupling capacitor.

According to an aspect of the present disclosure, a parallel connection of multiple series connections of a respective capacitor and a respective switching unit may be provided as a capacitor circuit. The switching units comprise voltage-activated non-Ohmic switching materials such as phase change material or an ovonic threshold switch material that turns on at a respective threshold voltage, which is also referred to as a turn-on voltage. According to an aspect of the present disclosure, the switching units are designed so that the threshold voltages are different from one another. In embodiments in which insufficient capacitance of the capacitor circuit causes a voltage spike in any of the switching units that exceeds the respective threshold voltage, at least one of the switching units of which the respective threshold voltage is exceeded by the voltage spike may turn on, thereby increasing the total capacitance of the capacitor circuit. The capacitance and the threshold voltage of each series connection of a capacitor and a switching unit may be selected such that a higher voltage spike turns on more of the switching units. As the total capacitance of the capacitor circuit increase, the magnitude of the voltage spike decreases, and thus, the total capacitance of the capacitor circuit converges to a value that is proximate to a predetermined value. Thus, the total capacitance of the capacitor circuit may be self-tailored to a value close to a target value without using any measurement circuitry or any programming circuitry by using the capacitor circuit of the present disclosure. The various embodiments of the present disclosure are now described with reference to accompanying drawings.

Referring to FIG. 1, an exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Semiconductor devices 701 such as field effect transistors may be formed over the top surface of the semiconductor material layer 9. For example, each field effect transistor may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor circuits, etc.), and are collectively referred to as CMOS circuitry 700.

One or more of the field effect transistors in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor in the CMOS circuitry 700 may include a single crystalline semiconductor channel such as a single crystalline silicon channel. In one embodiment, a subset of the field effect transistors in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first conductive line structures 618 formed in the first interconnect-level dielectric material layer 610, first conductive via structures 622 formed in a lower portion of the second interconnect-level dielectric material layer 620, second conductive line structures 628 formed in an upper portion of the second interconnect-level dielectric material layer 620, second conductive via structures 632 formed in a lower portion of the third interconnect-level dielectric material layer 630, third conductive line structures 638 formed in an upper portion of the third interconnect-level dielectric material layer 630, third conductive via structures 642 formed in a lower portion of the fourth interconnect-level dielectric material layer 640, and fourth conductive line structures 648 formed in an upper portion of the fourth interconnect-level dielectric material layer 640. While the present disclosure is described using an embodiment in which four levels conductive line structures are formed in dielectric material layers, embodiments are expressly contemplated herein in which a lesser or greater number of levels of conductive line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first conductive via structures 622 and the second conductive line structures 628 may be formed as integrated line and via structures by a dual damascene process. Generally, any contiguous set of a conductive line structure (628, 638, 648) and at least one underlying conductive via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628,

631, 638, 642, 648) may be formed in the dielectric material layers (601, 610, 620, 630, 640), and may be electrically connected to the semiconductor devices. The metal interconnect structures (612, 618, 622, 628, 631, 638, 642, 648) may be electrically connected to a respective one of the semiconductor devices 701. In one embodiment, each of the metal interconnect structures (612, 618, 622, 628, 631, 638, 642, 648) may comprise, and/or may consist essentially of, a respective set of at least one metallic material.

An optional dielectric capping layer 21 and a bottom-via-level dielectric layer 23 may be formed over the dielectric material layers (601, 610, 620, 630, 640). The optional dielectric capping layer 21 includes a dielectric capping material such as silicon carbide, silicon nitride, or silicon carbide nitride. Other suitable dielectric capping materials are within the contemplated scope of disclosure. The thickness of the optional dielectric capping layer 21, if present, may be in a range from 2 nm to 100 nm, although lesser and greater thicknesses may also be used. The bottom-via-level dielectric layer 23 comprises a dielectric material such as undoped silicate glass or a doped silicate glass. The bottom-via-level dielectric layer 23 may comprise a planar top surface, i.e., a top surface located entirely within a horizontal plane. The thickness of the bottom-via-level dielectric layer 23 may be in a range from 100 nm to 300 nm, such as from 120 nm to 200 nm, although lesser and greater thicknesses may also be used.

Bottom capacitor contact via structures 22 may be formed through the bottom-via-level dielectric layer 23 and the optional dielectric capping layer 21 directly on one of the underlying conductive line structures (such as a fourth conductive line structure 648). For example, via cavities may be formed through the bottom-via-level dielectric layer 23 and the optional dielectric capping layer 21, and may be subsequently filled with at least one metallic fill material to form the bottom capacitor contact via structures 22.

FIGS. 2A-2F are sequential vertical cross-sectional views of a first structure during formation of a device structure according to an embodiment of the present disclosure.

Figure 2A:
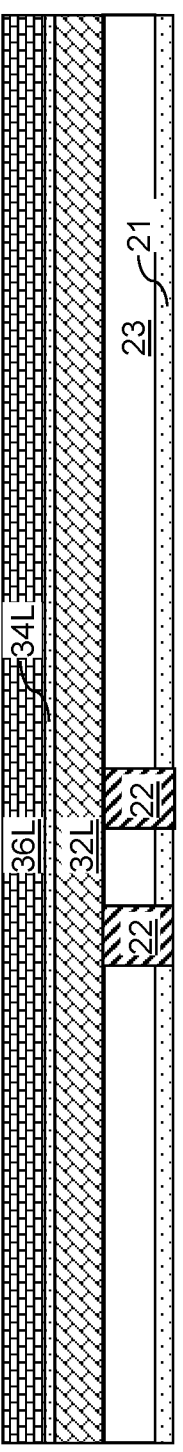
FIGS. 2A-2F are sequential vertical cross-sectional views of a first structure during formation of a device structure according to an embodiment of the present disclosure.

Referring to FIG. 2A, the first structure may be derived from the structure illustrated in FIG. 1 by sequentially forming a lower capacitor electrode layer 32L, a node dielectric layer 34L, and an upper capacitor electrode layer 36L. The lower capacitor electrode layer 32L comprises at least one first metallic material such as a conductive metallic nitride (such as TiN, TaN, WN, MoN, etc.), a conductive metallic carbide (such as TiC, TaC, WC, etc.), an elemental metal (such as Ti, Ta, W, Mo, Co, Ru, Cu, etc.), an intermetallic alloy, or a combination or a layer stack thereof. The thickness of the lower capacitor electrode layer 32L may be in a range from 5 nm to 100 nm, such as from 10 nm to 50 nm, although lesser and greater thicknesses may also be used.

The node dielectric layer 34L comprises a node dielectric material, which may be, for example, silicon nitride, a dielectric metal oxide, or a combination or a layer stack thereof. The thickness of the node dielectric layer 34L may be in a range from 4 nm to 10 nm, such as from 4 nm to 8 nm, although lesser and greater thicknesses may also be used.

The upper capacitor electrode layer 36L comprises at least one second metallic material such as a conductive metallic nitride (such as TiN, TaN, WN, MoN, etc.), a conductive metallic carbide (such as TiC, TaC, WC, etc.), an elemental metal (such as Ti, Ta, W, Mo, Co, Ru, Cu, etc.), an intermetallic alloy, or a combination or a layer stack thereof. The thickness of the upper capacitor electrode layer 36L may be in a range from 5 nm to 100 nm, such as from 10 nm to 50 nm, although lesser and greater thicknesses may also be used.

Figure 2B:
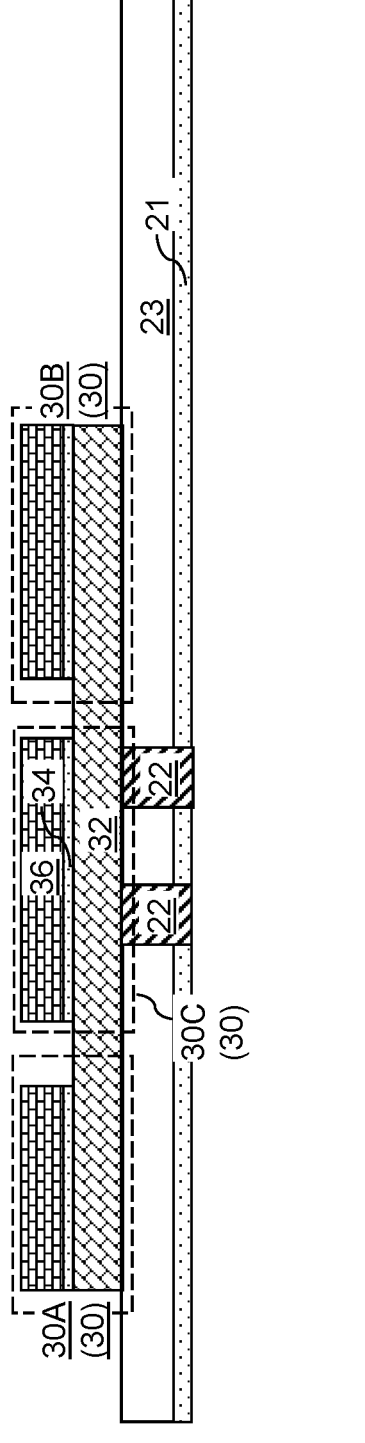

Referring to FIG. 2B, the layer stack of the lower capacitor electrode layer 32L, the node dielectric layer 34L, and the upper capacitor electrode layer 36L may be patterned into a plurality of capacitors 30. For example, a first photoresist layer may be applied over the layer stack (32L, 34L, 36L), and may be lithographically patterned to cover an area in which capacitors are to be subsequently formed. A first anisotropic etch process may be performed to remove portions of the layer stack (32L, 34L, 36L) that are not covered by the first photoresist layer. The first photoresists layer may be removed, for example, by ashing. A second photoresist layer may be applied over the patterned portion of the layer stack (32L, 34L, 36L), and may be lithographically patterned to form line-shaped openings over areas of gaps selected from the capacitors to be subsequently formed. A second anisotropic etch process may be performed to divide the upper capacitor electrode layer 36L into multiple areas. The node dielectric layer 34 may, or may not, be divided into multiple discrete portions. The second photoresists layer may be removed, for example, by ashing.

Each patterned portion of the upper capacitor electrode layer 36L constitutes an upper capacitor electrode plate 36 of a respective capacitor 30. Each portion of the node dielectric layer 34L that underlies, and having an areal overlap with, a respective overlying upper capacitor electrode plate 36 constitutes a node dielectric 34. Each portion of the lower capacitor electrode layer 32L that underlies, and having an areal overlap with, a respective overlying upper capacitor electrode plate 36 constitutes a lower capacitor electrode plate 32.

Each combination of an upper capacitor electrode plate 36, a node dielectric 34 that underlies the upper capacitor electrode plate 36, and a lower capacitor electrode plate 32 that underlies the upper capacitor electrode plate 36 constitutes a capacitor 30. A plurality of capacitors 30 may be formed. In the illustrated example in FIG. 2B, three capacitors 30 are illustrated, which comprise a first capacitor 30A, a second capacitor 30B, and a third capacitor 30C. While the present disclosure is described using an embodiment in which three capacitors 30 are formed, embodiments are expressly contemplated herein in which the total number of capacitors is 1, 2, 4, 5, 6, or any integer greater than 6.

The area of each capacitor 30, and thus, the capacitance of each capacitor 30, may be the same, or may be different. In one embodiment, the capacitors 30 may be formed with a same size. In another embodiment, the capacitors 30 may be formed with different sizes. In yet another embodiment, the capacitors 30 may be formed in multiple groups such that the capacitance is the same within the same group, but differ from other different groups. In still another embodiment, the capacitors 30 may be formed such that the values of the capacitance form a geometrical sequence such as $C_0 R^{(i-1)}$ for each positive integer value i that is used to label the capacitors, i being positive integers beginning with 1, $C_0$ being the value of the smallest capacitance, and R being the ratio of the capacitances between sequentially numbered capacitors and having a value greater than 1. Generally, the values for the capacitance of the capacitors may be independent from one another. In some embodiment, the values of the capacitance of the capacitors 30 may be selected such that about one half of all of the capacitors 30 may provide a target capacitance value under nominal process conditions when connected in a parallel connection to one another, and the range of capacitance values that may be obtained by parallel connection of the capacitors 30 may be wide enough to cover the entire range of capacitance values that may be needed under extreme process conditions that may occur during the manufacturing process.

The upper capacitor electrode plates 36 of the capacitors 30 are formed as discrete conductive electrode plates that do not contact one another. For example, the upper capacitor electrode plate 36 of the first capacitor 30A and the upper capacitor electrode plate 36 of the second capacitor 30B comprise discrete conductive electrode plates that do not contact each other.

In some embodiments, the second anisotropic etch process may pattern the upper capacitor electrode layer 36L and does not pattern the lower capacitor electrode layer 32L. In this embodiment, the lower capacitor electrode plates 32 of the capacitors 30 may be merged as a single conductive electrode plate, i.e., as a single continuous lower capacitor electrode plate. For example, the lower capacitor electrode plates 32 of the first capacitor 30A and the second capacitor 30B (and any additional capacitor 30) are merged as a single conductive electrode plate.

The node dielectric 34 may, or may not, be divided by the second anisotropic etch process. Thus, the node dielectrics 34 may be formed as multiple discrete node dielectrics, or may be formed as a single continuous node dielectric layer. Generally, each of the capacitors 30 comprises a respective metal-insulator-metal (MIM) capacitor that includes a respective lower capacitor electrode plate 32 and a respective upper capacitor electrode plate 36.

Figure 2C:
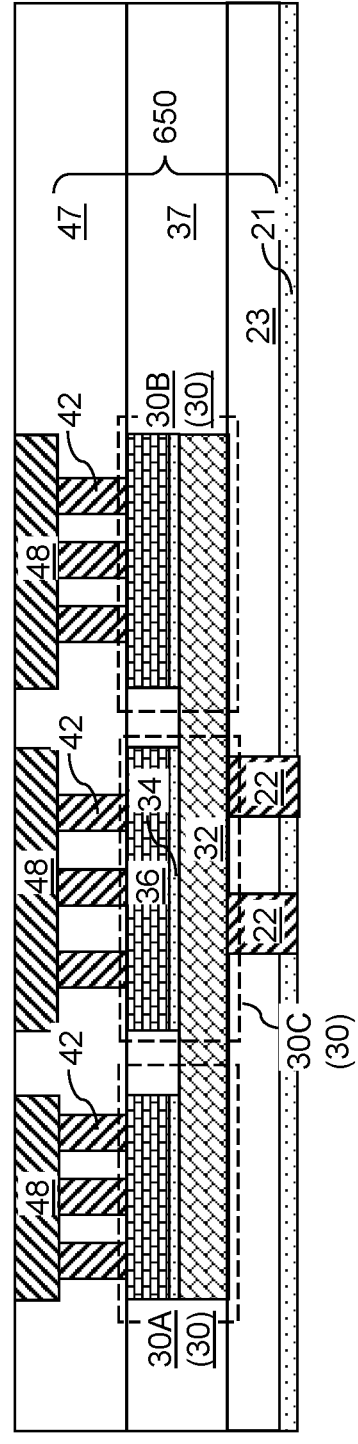

Referring to FIG. 2C, at least one dielectric layer (37, 47) may be subsequently deposited over the capacitors 30. The portion of the at least one dielectric layer (37, 47) that underlies a horizontal plane including top surfaces of the upper capacitor electrode plates 36 is herein referred to as a capacitor-level dielectric layer 37. The portion of the at least one dielectric layer (37, 47) that overlies the horizontal plane including the top surfaces of the upper capacitor electrode plates 36 is herein referred to as upper-connection-level dielectric layer 47. The capacitor-level dielectric layer 37 and the upper-connection-level dielectric layer 47 may be formed as a single dielectric material layer, or may be formed as multiple dielectric material layers. The combination of the optional dielectric capping layer 21, the bottom-via-level dielectric layer 23, the capacitor-level dielectric layer 37, and the upper-connection-level dielectric layer 47 may be an interconnect-level dielectric material layer through which conductive via structures and conductive line structures are formed. The combination of the optional dielectric capping layer 21, the bottom-via-level dielectric layer 23, the capacitor-level dielectric layer 37, and the upper-connection-level dielectric layer 47 is herein referred to as a fifth interconnect-level dielectric material layer 650.

Conductive via structures and conductive line structures may be formed in the fifth interconnect-level dielectric material layer 650. The conductive via structures that are formed in the fifth interconnect-level dielectric material layer 650 are referred to as fourth conductive via structures, and the conductive line structures that are formed in the fifth interconnect-level dielectric material layer 650 are referred to as fifth conductive line structures. A first subset of the fourth conductive via structures (not illustrated) that are formed outside the areas of the capacitors 30 may vertically extend through the optional dielectric capping layer 21, the bottom-via-level dielectric layer 23, the capacitor-level dielectric layer 37, and a lower portion of the upper-connection-level dielectric layer 47, and may contact a top surface of a respective fourth conductive line structure 648.

A second subset of the fourth conductive via structures that are formed on a respective one of the upper capacitor electrode plates 36 is herein referred to as top capacitor contact via structures 42.

Each of the fifth conductive line structures may be formed as a line portion of an integrated line and via structure that also includes a respective fourth conductive via structure, or may be formed as a separate structure that is formed on at least one top surface of at least one underlying fourth conductive via structure. A first subset of the fifth conductive line structures may be formed outside the areas of the capacitors 30. A second subset of the fifth conductive line structures may be formed within the areas of the capacitors 30 on a respective subset of the top capacitor contact via structures 42. Generally, the first subset of the fifth conductive line structures and the second subset of the fifth conductive line structures may be formed simultaneously and may comprise a same set of at least one metallic material, or may be formed using different sets of processing steps and thus, may comprise different sets of at least one metallic material.

In one embodiment, the second subset of the fifth conductive line structures comprises a first subset of conductive electrodes for non-Ohmic switching devices. The first subset of the conductive electrodes for the non-Ohmic switching devices is collectively referred to as primary switch electrodes 48. According to an aspect of the present disclosure, the primary switch electrodes 48 comprises a material that is resistant to electromigration and outdiffusion of material under external electrical bias voltage. For example, the primary switch electrodes 48 may comprise, and/or may consist essentially of, at least one metallic barrier material, at least one refractory metal, a high conductivity metal, a conductive metal oxide, a heavily doped semiconductor material, alloys or compounds thereof, and/or a layer stack thereof. Non-limiting exemplary metallic barrier materials that may be used for the primary switch electrode 4856 include TiN, TaN, WN, MoN, TiC, TaC, WC, etc. Refractory metals include W, Ta, Re, Mo, and Nb. Non-limiting examples of high conductivity metal comprise Os, Ir, Pt, Au, Pd, Ni, Al, Ti, etc. A non-limiting example of a conductive metal oxide is iridium oxide ($IrO_2$). Non-limiting examples of heavily doped semiconductor materials include heavily p-doped polysilicon, heavily n-doped polysilicon, a heavily doped silicon-germanium alloy, etc. As used herein, a heavily doped semiconductor material refers to a semiconductor material including electrical dopants at an atomic concentration greater than $1.0 \times 10^{20}/cm^3$.

In some embodiments, each of the primary switch electrodes 48 may, or may not, comprise a respective lower portion composed of copper or aluminum. In one embodiment, the first subset of the fifth conductive line structures that is formed outside the areas of the capacitors 30 may comprise copper or aluminum, and each of the primary switch electrodes 48 may comprise a respective lower portion composed of copper or aluminum. In one embodiment, the primary switch electrodes 48 may comprise an upper portion including a conductive material that is different from copper or aluminum. In this embodiment, the first subset of the fifth conductive line structures that is formed outside the areas of the capacitors 30 may, or may not, comprise the conductive material of the upper portions of the primary switch electrodes 48. In one embodiment, the primary switch electrodes 48 may comprise, and/or may consist essentially of, a conductive material that is different from copper or aluminum, and the first subset of the fifth conductive line structures may comprise a different material than the conductive material of the primary switch electrodes 48. In one embodiment, the first subset of the fifth conductive line structures may comprise copper and/or aluminum, and the primary switch electrodes 48 may be free of copper and/or aluminum.

The height of each primary switch electrode 48 may be in a range from 30 nm to 500 nm, such as from 50 nm to 300 nm, although lesser and greater thicknesses may also be used. In one embodiment, top surfaces of the primary switch electrodes 48 may be located within the horizontal plane including the top surface of the fifth interconnect-level dielectric material layer 650.

In one embodiment, the upper capacitor electrode plate 36 of each capacitor 30 may be contacted by at least one conductive via structure (such as at least one top capacitor contact via structures 42) that is electrically connected to a respective primary switch electrode. For example, the upper capacitor electrode plate 36 of the first capacitor 30A may be contacted by at least one first conductive via structure (such as at least one first top capacitor contact via structures 42) that is electrically connected to a first primary switch electrode 48; the upper capacitor electrode plate 36 of the second capacitor 30B may be contacted by at least one second conductive via structure (such as at least one second top capacitor contact via structures 42) that is electrically connected to the second primary switch electrode 48; and the upper capacitor electrode plate 36 of the third capacitor 30C may be contacted by at least one third conductive via structure (such as at least one third top capacitor contact via structures 42) that is electrically connected to the third primary switch electrode 48.

Figure 2D:
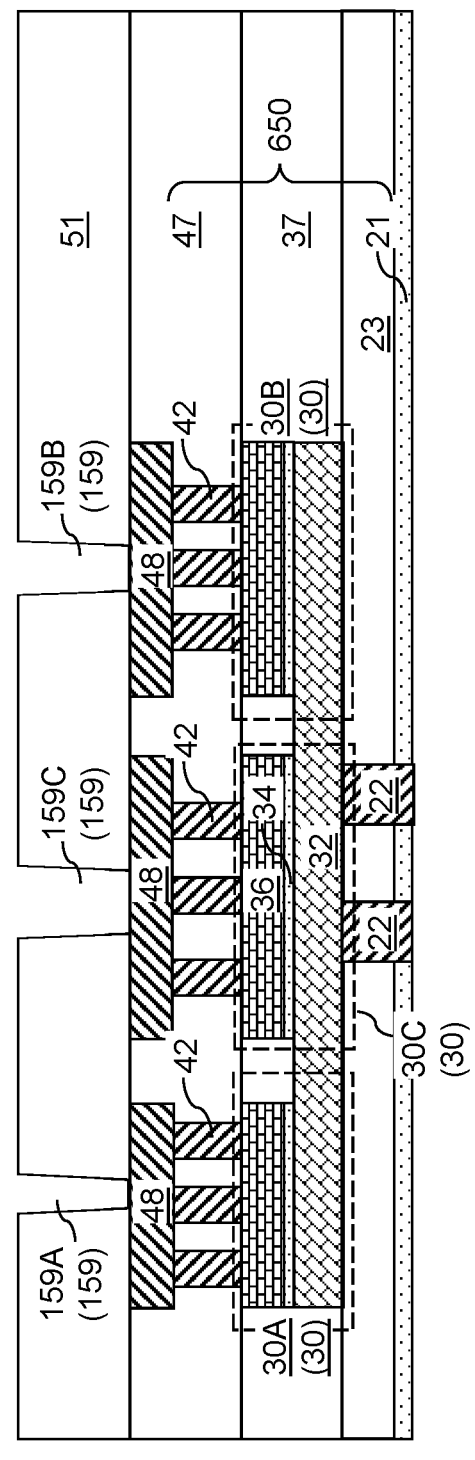

Referring to FIG. 2D, a via-level dielectric material layer 51 may be formed over the primary switch electrodes 48 and the dielectric material layer that embeds the primary switch electrodes 48 (such as the fifth interconnect-level dielectric material layer 650). The via-level dielectric material layer 51 comprises a dielectric material such as undoped silicate glass, a doped silicate glass, silicon nitride, or a combination or a layer stack thereof. The thickness of the via-level dielectric material layer 51 may have a thickness in a range from 30 nm to 500 nm, such as from 60 nm to 300 nm, although lesser and greater thicknesses may also be used.

A photoresist layer (not shown) may be applied over the via-level dielectric material layer 51, and may be lithographically patterned to form discrete openings therein. The openings in the photoresist layer may be formed within the areas of the primary switch electrodes 48. An anisotropic etch process may be performed to transfer the pattern of the openings in the photoresist layer through the via-level dielectric material layer 51. Via cavities 159 may be formed through the via-level dielectric material layer 51. A top surface segment of a respective switch electrode 48 may be physically exposed underneath each via cavity 159. For example, the via cavities 159 may comprise a first via cavity 159A that overlies a first primary switch electrode 48 that is electrically connected to the upper capacitor electrode plate 36 of the first capacitor 30A, a second via cavity 159B that overlies a second primary switch electrode 48 that is electrically connected to the upper capacitor electrode plate 36 of the second capacitor 30B, a third via cavity 159C that overlies a third primary switch electrode 48 that is electrically connected to the upper capacitor electrode plate 36 of the third capacitor 30C, etc.

In some embodiment, the via cavities 159 may be formed with different sizes. For example, the via cavities 159 may be formed with different maximum diameters to provide different volumes. The different sizes of the via cavities 159 may be advantageously used to provide different threshold voltages to the non-Ohmic switching material portions to be subsequently formed therein.

Figure 2E:
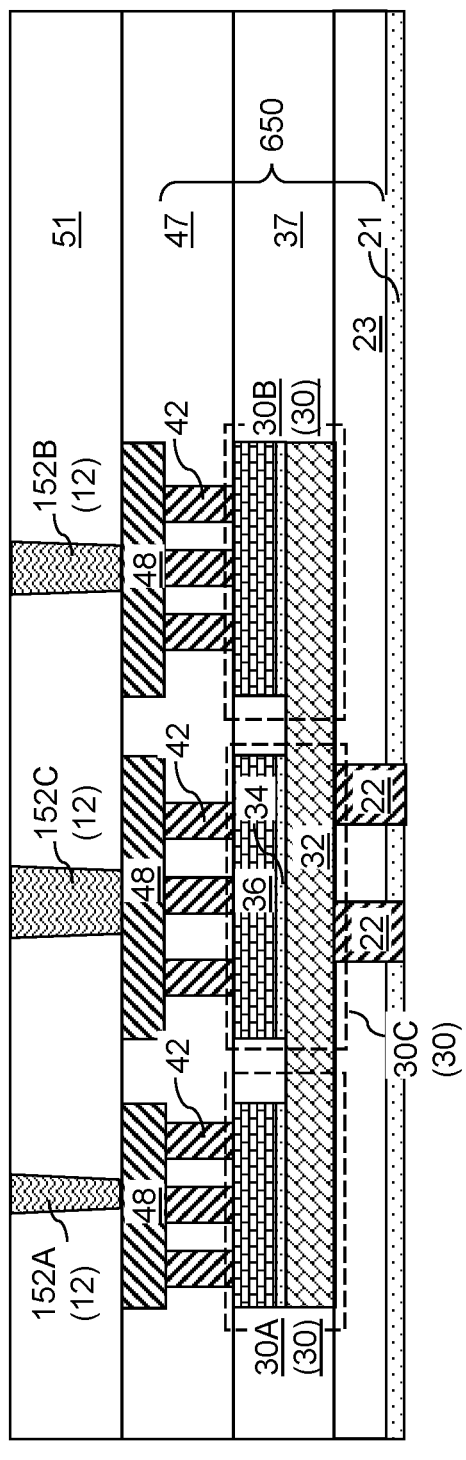

Referring to FIG. 2E, at least one non-Ohmic switching material may be deposited in the via cavities 159, and excess portions of the at least one non-Ohmic switching material may be removed from outside the via cavities 159, i.e., from above the horizontal plane including the top surface of the via-level dielectric material layer 51. As used herein, a non-Ohmic material refers to a material that exhibits non-linear current characteristics as a function of an applied external voltage. As used herein, a non-Ohmic switching material refers to a non-Ohmic material that exhibits a higher effective resistivity (i.e., resistance divided by the distance and multiplied by the area) at a low applied voltage, and a low effective resistivity at a high applied voltage. The highest voltage at which the non-Ohmic switching material exhibits the higher effective resistivity is herein referred to as a critical voltage. Generally, a non-Ohmic switching material has an intrinsic critical electrical field at which the characteristics of the non-Ohmic switching material transitions from a high resistivity state to a low resistivity state as a function of an increasing external electrical field. The critical voltage is typically the product of the intrinsic critical electrical field and the thickness (or the dimension along the electrical field) of the non-Ohmic switching material.

Each remaining portion of the at least one non-Ohmic switching material that fills a respective via cavity 159 constitutes a non-Ohmic switching material portion 12, which is a non-Ohmic switching material via structure (152A, 152B, 152C). A non-Ohmic switching material via structure (152A, 152B, 152C) may be formed on a top surface of each of the primary switch electrodes 48. The non-Ohmic switching material via structures (152A, 152B, 152C) may comprise a first non-Ohmic switching material via structure 152A that is formed on a top surface of a primary switch electrode 48 that is electrically connected to the upper capacitor plate electrode 36 of the first capacitor 30A; a second non-Ohmic switching material via structure 152B that is formed on a top surface of a primary switch electrode 48 that is electrically connected to the upper capacitor plate electrode 36 of the second capacitor 30B; a third non-Ohmic switching material via structure 152C that is formed on a top surface of a primary switch electrode 48 that is electrically connected to the upper capacitor plate electrode 36 of the third capacitor 30C, etc.

In one embodiment, each of the non-Ohmic switching material portions 12 may comprise a same non-Ohmic switching material. In this embodiment, the non-Ohmic switching material portions 12 have different lateral dimensions to provide different threshold voltages. Alternatively, the non-Ohmic switching material portions 12 may comprise different non-Ohmic switching materials or different combinations of at least two non-Ohmic switching materials. In this embodiment, the via cavities 159 may be formed at different processing steps and may be filled within different on-Ohmic switching materials. In other words, multiple iterations of processing sequences may be formed to provide non-Ohmic switching material portions 12 containing different non-Ohmic switching materials. Each iteration of processing sequences may comprise a respective via cavity formation step that forms a respective subset of the via cavities 159, and a respective on-Ohmic switching material deposition step that forms a respective subset of non-Ohmic switching material portions 12. Generally, the non-Ohmic switching material portions 12 may be formed to provide different threshold voltages at which the electrical characteristics of the respective non-Ohmic switching material portion 12 makes a transition from an electrically non-conductive state to an electrically conductive state.

Generally, each of the non-Ohmic switching material portions 12 comprises a respective ovonic threshold material or a respective phase change memory material.

In one embodiment, at least one, a plurality, or each, of the non-Ohmic switching material portions 12 comprises, and/or consists essentially of, an ovonic threshold material such as a germanium-antimony-tellurium compound, a germanium-tellurium compound, a germanium-antimony compound, an antimony-tellurium compound, a germanium selenium compound, a germanium-selenium-nitrogen compound, a germanium-selenium-arsenic compound, a germanium-selenium-antimony compound, a silicon-tellurium compound, a zinc-tellurium compound, a carbon-tellurium compound, a boron-tellurium compound, a germanium-arsenic-tellurium compound, etc. The ovonic threshold material may, or may not, be doped with at least one dopant atom for enhancing the electrical characteristics such as the switching characteristics. The at least one dopant atom may comprise one or more of Si, N, O, Ni, Al, Ti, W, Cu, C, B, Sn, In, Ag, etc.

Alternatively or additionally, at least one, a plurality, or each, of the non-Ohmic switching material portions 12 may comprise, and/or may consist essentially of, a phase change memory material. As used herein, a "phase change memory material" refers to a material having at least two different phases providing different resistivity. A phase change memory (PCM) material may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). Exemplary phase change memory materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. Generally, a phase change memory material may, or may not, be an ovonic threshold material, and an ovonic threshold material may, or may not, be a phase change memory material.

The top surfaces of the switching material portions 12, which may be comprised as the non-Ohmic switching material via structures (152A, 152B, 152C), may be formed within the horizontal plane including the top surface of the via-level dielectric material layer 51.

Figure 2F:
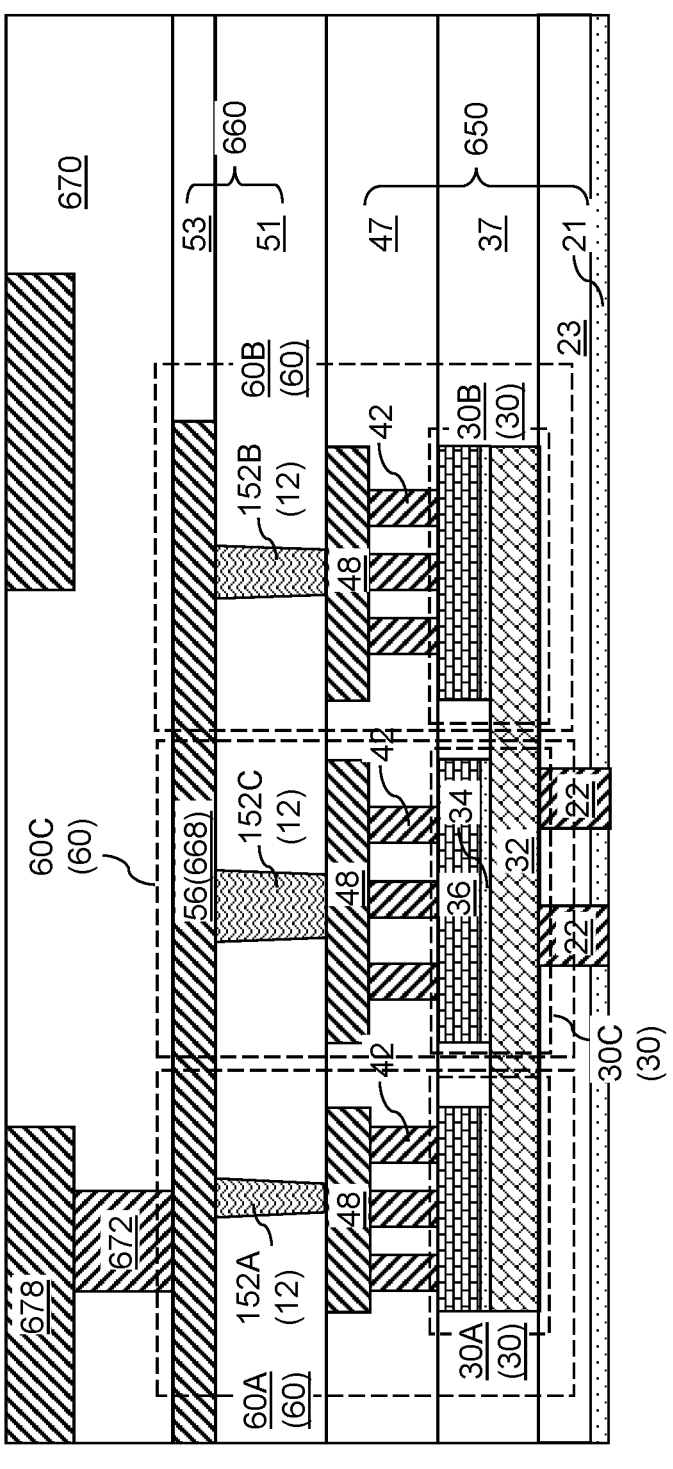

Referring to FIG. 2F, a line-level dielectric material layer 53 and sixth conductive line structures 668 may be formed over the via-level dielectric material layer 51. The combination of the via-level dielectric material layer 51 and the line-level dielectric material layer 53 is herein referred to as an interconnect-level dielectric layer, or as a sixth interconnect-level dielectric material layer 660. The sixth conductive line structures 668 are conductive line structures, such as metallic line structures, that are formed in the sixth interconnect-level dielectric material layer 660.

The sixth conductive line structures 668 may comprise a first subset of the sixth conductive line structures 668 that are formed outside the areas of the capacitors 30 and are used as metal interconnect lines for semiconductor devices 701, and a second subset of the sixth conductive line structures 668 that are used as secondary switch electrodes 56. Fifth conductive via structures (not shown) may be formed outside the areas of the capacitors 30, and the first subset of the sixth conductive line structures 668 may be formed on a top surface of a respective one of the fifth conductive via structures. Alternatively, the fifth conductive via structures and the first subset of the sixth conductive line structures 668 may be formed as integrated line and via structures. The first subset of the sixth conductive line structures 668 and the second subset of the sixth conductive line structures 668 may, or may not, comprise a same set of conductive materials. For example, the first subset of the sixth conductive line structures 668 may comprise copper-based metal portions and/or aluminum-based metal portions. The second subset of the sixth conductive line structures 668, which comprise the secondary switch electrodes 56, may comprise any material that may be used for the primary switch electrodes 48 as discussed above.

In one embodiment, the secondary switch electrodes 56 may be interconnected to one another as a single continuous conductive structure. In this embodiment, each secondary switch electrode 56 of non-Ohmic switching devices to be subsequently discussed may be physically comprised as a portion of a single secondary switch electrode 56. Further, while the present disclosure is described using an embodiment in which all secondary switch electrodes 56 are merged as a single conductive structure, embodiments are expressly contemplated herein in which the secondary switch electrodes 56 are formed as discrete structures, and are electrically connected to one another by a set of metal interconnect structures (such as metal via structures and/or metal line structures) to be subsequently formed. Generally, all secondary switch electrodes 56 for a plurality of non-Ohmic switching devices may be electrically connected to one another either by forming the secondary switch electrodes 56 as a single continuous conductive structure, or by forming the secondary switch electrodes 56 as discrete conductive structures and subsequently providing electrically conductive paths to one another, for example, using a set of metal interconnect structures.

According to an aspect of the present disclosure, the secondary switch electrodes 56 comprises a material that may be resistant to electromigration and outdiffusion of material under external electrical bias voltage. For example, the secondary switch electrodes 56 may comprise, and/or may consist essentially of, at least one metallic barrier material, at least one refractory metal, a high conductivity metal, a conductive metal oxide, a heavily doped semiconductor material, alloys or compounds thereof, and/or a layer stack thereof.

In some embodiments, each of the secondary switch electrodes 56 may, or may not, comprise a respective upper portion composed of copper or aluminum. In one embodiment, the first subset of the sixth conductive line structures 668 that is formed outside the areas of the capacitors 30 may comprise copper or aluminum, and each of the upper switch electrodes 56 may comprise a respective upper portion composed of copper or aluminum. In one embodiment, the secondary switch electrodes 56 may comprise a lower portion including a conductive material that is different from copper or aluminum. In this embodiment, the first subset of the sixth conductive line structures 668 that is formed outside the areas of the capacitors 30 may, or may not, comprise the conductive material of the lower portions of the secondary switch electrodes 56. In one embodiment, the secondary switch electrodes 56 may comprise, and/or may consist essentially of, a conductive material that is different from copper or aluminum, and the first subset of the sixth conductive line structures 668 may comprise a different material than the conductive material of the secondary switch electrodes 56. In one embodiment, the first subset of the sixth conductive line structures 668 may comprise copper and/or aluminum, and the secondary switch electrodes 56 may be free of copper and/or aluminum.

The height of each secondary switch electrode 56 may be in a range from 30 nm to 500 nm, such as from 50 nm to 300 nm, although lesser and greater thicknesses may also be used. In one embodiment, top surfaces of the secondary switch electrodes 56 may be located within the horizontal plane including the top surface of the sixth interconnect-level dielectric material layer 660.

Subsequently, a seventh interconnect-level dielectric material layer 670, sixth conductive via structures 672, and seventh conductive line structures 678 may be formed above the sixth interconnect-level dielectric material layer 660. Optionally, additional seventh interconnect-level dielectric material layers (not shown), additional conductive via structures (not shown), and additional conductive line structures (not shown) may be formed above the seventh interconnect-level dielectric material layer 670. Metal bonding structures, such as metal bonding pads, and a passivation dielectric layer may be formed at the topmost level of the interconnect-level dielectric material layers.

Generally, a capacitor circuit may be formed over the lower-level dielectric material layers (601, 610, 620, 630, 640), which may also be referred to as first dielectric material layers. The capacitor circuit comprises a parallel connection of capacitor-switch assemblies 60. The parallel connection of capacitor-switch assemblies may comprise: a first capacitor-switch assembly 60A that comprises a first series connection of a first capacitor 30A and a first non-Ohmic switching device (48, 12, 56) which has a first threshold voltage and comprises a first primary switch electrode 48, a first secondary switch electrode 56, and a first non-Ohmic switching material portion 12 contacting the first primary switch electrode 48 and the first secondary switch electrode 56, and a second capacitor-switch assembly 60B that comprises a second series connection of a second capacitor 30B and a second non-Ohmic switching device (48, 12, 56) which has a second threshold voltage and comprises a second primary switch electrode 48, a second secondary switch electrode 56, and a second non-Ohmic switching material portion 12 contacting the second primary switch electrode 48 and the second secondary switch electrode 56. According to an aspect of the present disclosure, the second threshold voltage is different from the first threshold voltage. The capacitance of the second capacitor 30B may be the same as, or may be different from, the first capacitor 30A.

Additionally, the parallel connection of capacitor-switch assemblies may comprise: a third capacitor-switch assembly 60C that comprises a third series connection of a third capacitor 30C and a third non-Ohmic switching device (48, 12, 56) which has a third threshold voltage and comprises a third primary switch electrode 48, a third secondary switch electrode 56, and a third non-Ohmic switching material portion 12 contacting the third primary switch electrode 48 and the third secondary switch electrode 56, and optionally at least one additional capacitor-switch assembly (not illustrated) that comprises a respective additional series connection of an additional capacitor 30 and an additional non-Ohmic switching device (48, 12, 56) which has a respective threshold voltage and comprises a respective primary switch electrode 48, a respective secondary switch electrode 56, and a respective non-Ohmic switching material portion 12 contacting the respective primary switch electrode 48 and the respective secondary switch electrode 56. According to an aspect of the present disclosure, the threshold voltages of the non-Ohmic switching devices (48, 12, 56) may be different from one another.

In one embodiment, the first non-Ohmic switching material portion 12 is formed as a first via structure on a top surface of the first primary switch electrode 48, and the second non-Ohmic switching material portion 12 is formed as a second via structure on a top surface of the second primary switch electrode 48.

In one embodiment, each of the capacitors 30 (such as the first capacitor 30A, the second capacitor 30B, etc.), and each of the non-Ohmic switching devices (48, 12, 560) (such as the first non-Ohmic switching device (48, 12, 56), and the second non-Ohmic switching device (48, 12, 56), etc.) are in contact with a respective one of the dielectric material layers (650, 660). In one embodiment, each of the non-Ohmic switching material portions 12 (such as the first non-Ohmic switching material portion 12, the second non-Ohmic switching material portion 12, etc.) comprises a respective sidewall that contacts a first dielectric material layer (such as a via-level dielectric material layer 51) selected from the dielectric material layers (650, 660).

In one embodiment, each primary switch electrode 48 contacts a bottom surface of a respective non-Ohmic switching material portion 12, and each secondary switch electrode 56 contacts a top surface of a respective non-Ohmic switching material portion 12.

Figure 2G:
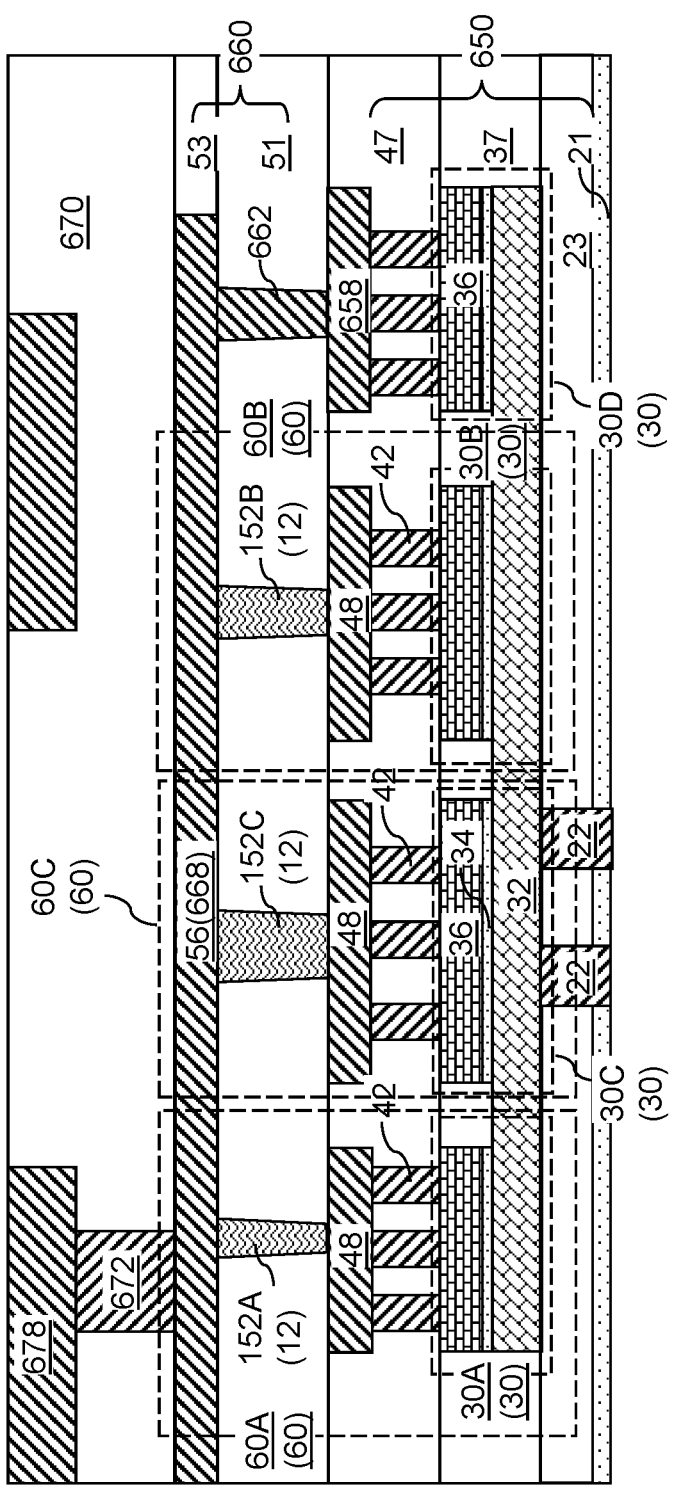
FIG. 2G is a vertical cross-sectional view of an alternative embodiment of the first structure according to an embodiment of the present disclosure.

Referring to FIG. 2G, an alternative embodiment of the first structure according to an embodiment of the present disclosure may be derived from the first structure illustrated in FIG. 2F by forming an additional capacitor 30D that is connected to the parallel connection of capacitor-switch assemblies illustrated in FIG. 2F in a parallel connection. In this embodiment, a fifth conductive via structure 662 may be provided between the secondary switch electrodes 56 of the parallel connection of capacitor-switch assemblies and a fifth conductive line structure 658 that is electrically connected to the upper capacitor electrode plate 36 of the additional capacitor 30D. The fifth conductive via structure 662 consists of at least one conductive material, and thus, provides a conductive path between the secondary switch electrodes 56 of the parallel connection of capacitor-switch assemblies and the upper capacitor electrode plate 36 of the additional capacitor 30D. As such, the additional capacitor 30D is always connected to the parallel connection of capacitor-switch assemblies, and provides a capacitive coupling path between the two end nodes of the parallel connection of capacitor-switch assemblies irrespective of the state of the non-Ohmic switching devices (48, 12, 56).

Figure 3A:
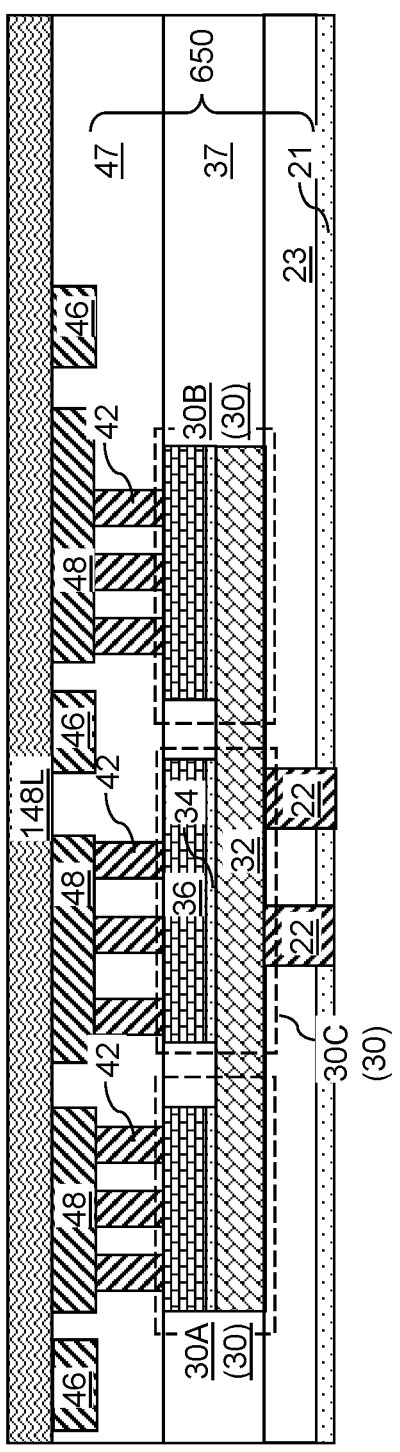
FIGS. 3A-3C are sequential vertical cross-sectional views of a second structure during formation of a device structure according to an embodiment of the present disclosure.
Figure 3B:
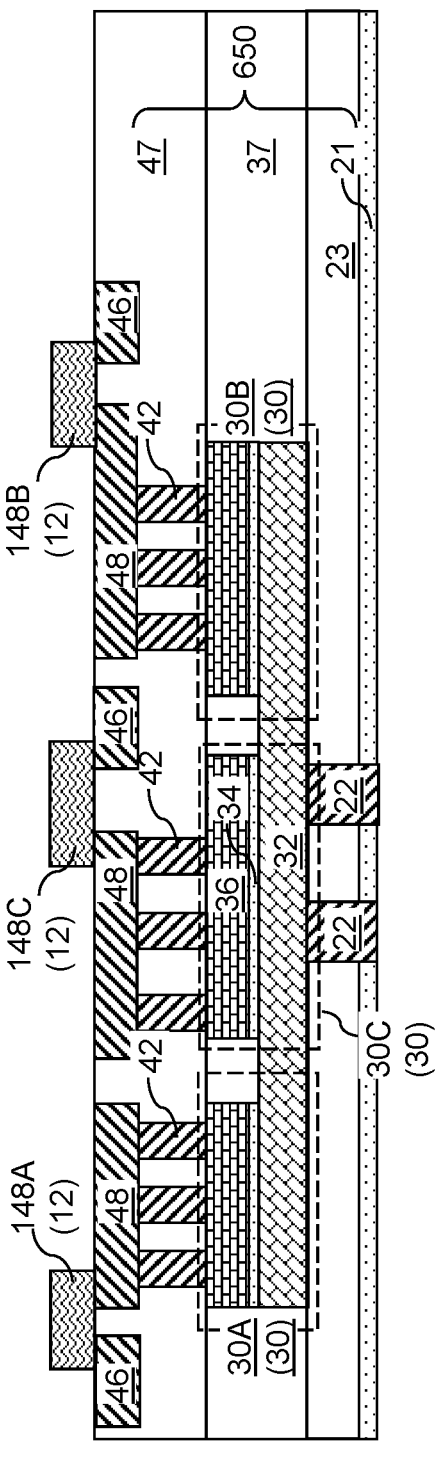
Figure 3C:
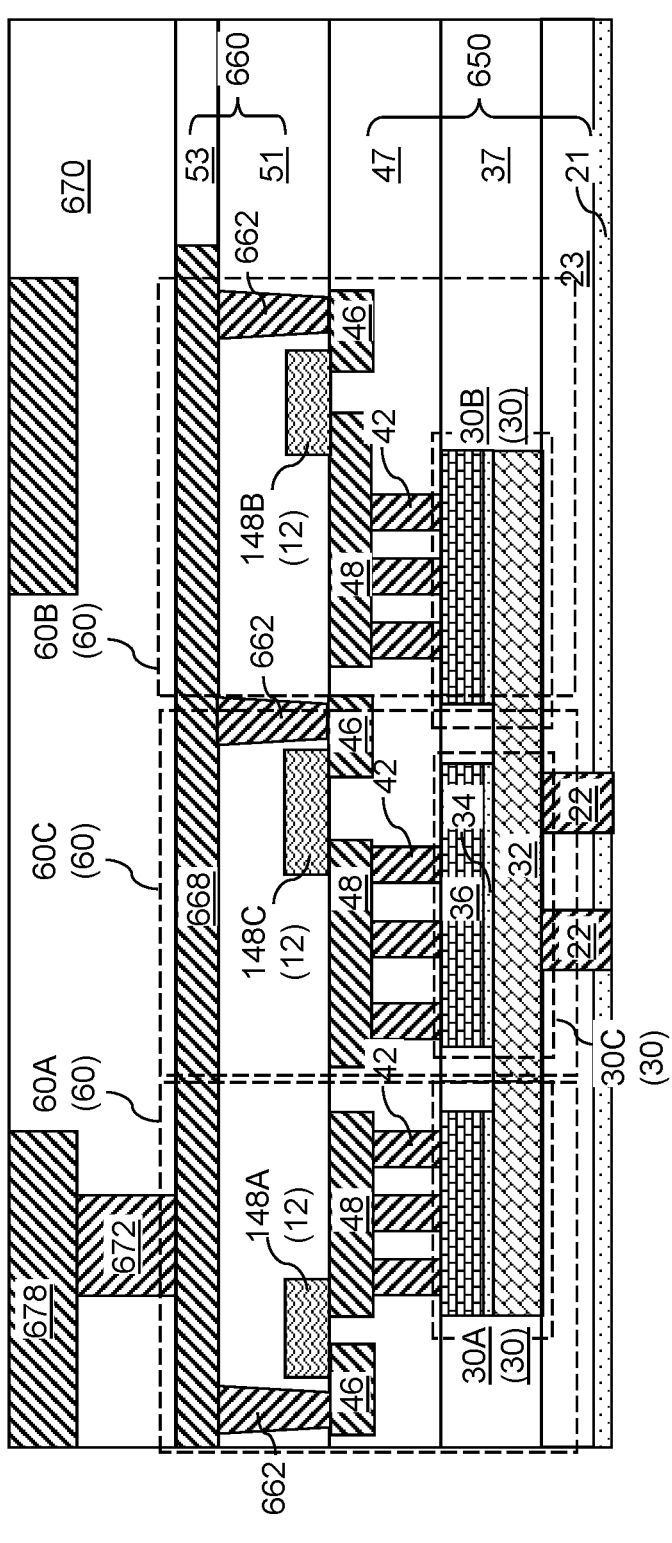

FIGS. 3A-3C are sequential vertical cross-sectional views of a second structure during formation of a device structure according to an embodiment of the present disclosure.

Referring to FIG. 3A, the second exemplary structure may be derived from the first exemplary structure illustrated in FIG. 2C by forming additional conductive line structures simultaneously with formation of the primary switch electrodes 48. The additional conductive line structures are subsequently used as secondary switch electrodes 46 for a respective non-Ohmic switching device to be subsequently formed. The secondary switch electrodes 46 may comprise the same set of at least one conductive material as, and may have the same thickness as, the primary switch electrodes 48. The layout of the primary switch electrodes 48 may be modified as needed to accommodate formation of the secondary switch electrodes 46 adjacent to a respective one of the primary switch electrodes 48.

According to an aspect of the present disclosure, each secondary switch electrode 46 may be formed adjacent to a respective one of the primary switch electrodes 48. Generally, the secondary switch electrodes 46 may be formed as a single continuous structure, or may be formed as multiple discrete structures that are electrically connected to one another by metal interconnect structures to be subsequently formed. While the present disclosure is described using an embodiment in which the secondary switch electrodes 46 are formed as discrete material portions, embodiments are expressly contemplated herein in which the secondary switch electrodes 46 are formed as a single interconnected conductive structure.

A non-Ohmic switching material layer 148L may be deposited over the top surface of the upper-connection-level dielectric layer 47, the primary switch electrodes 48, and the secondary switch electrodes 46. The material(s) of the non-Ohmic switching material layer 148L may comprise any material that may be used for the non-Ohmic switching material portions 12 described with reference to FIG. 2E. The thickness of the non-Ohmic switching material layer 148L may be in range from 30 nm to 500 nm, such as from 60 nm to 300 nm, although lesser and greater thicknesses may also be used.

Referring to FIG. 3B, the non-Ohmic switching material layer 148L may be lithographically patterned to form various non-Ohmic switching material portions 12. For example, a photoresist layer (not shown) may be applied over the non-Ohmic switching material layer, and may be lithographically patterned to form discrete photoresist material portions that extend between, and cover end portions of, neighboring pairs of a primary switch electrode 48 and a secondary switch electrode 48. An etch process may be performed to remove portions of the non-Ohmic switching material layer that are not covered by the discrete photoresist material portions. The photoresist material portions may be subsequently removed, for example, by ashing. In some embodiments, multiple non-Ohmic switching material layers having different material compositions and/or different thicknesses may be used to provide multiple non-Ohmic switching material portions 12 having different material compositions and/or different thicknesses.

In embodiments in which multiple non-Ohmic switching material layers are used to form the non-Ohmic switching material portions 12, different non-Ohmic materials and/or different thicknesses for the non-Ohmic materials may be used to provide different threshold voltages for the non-Ohmic switching material portions 12. Additionally or alternatively, different spacings between a respective neighboring pair of a primary switching electrode 48 and a secondary switching electrode 46 may be used to provide multiple non-Ohmic switching material portions 12 having different threshold voltages.

In the second exemplary structure, each non-Ohmic switching material portion 12 may be formed as a plate structure (148A, 148B, 148C) having a respective uniform thickness throughout on a top surface of a respective primary switch electrode 48 and on a top surface of a respective secondary switch electrode 46. In an illustrative example, the plate structures (148A, 148B, 148C) may comprise a first plate structure 148A, a second plate structure 148B, a third plate structure 148C, etc. In one embodiment, a first non-Ohmic switching material portion 12 may be formed as a first plate structure 148A having a uniform thickness throughout on a top surface of the first primary switch electrode 48 and on a top surface of the first secondary switch electrode 46; a second non-Ohmic switching material portion 12 may be formed as a second plate structure 148B having the uniform thickness throughout on a top surface of the second primary switch electrode 48 and on a top surface of the second secondary switch electrode 46, a third non-Ohmic switching material portion 12 may be formed as a third plate structure 148C having the uniform thickness throughout on a top surface of the third primary switch electrode 48 and on a top surface of the third secondary switch electrode 46, etc.

Referring to FIG. 3C, a via-level dielectric material layer 51 and a line-level dielectric material layer 53 may be formed over the non-Ohmic switching material portions 12. The combination of the via-level dielectric material layer 51 and the line-level dielectric material layer 53 is herein referred to as an interconnect-level dielectric layer, or as a sixth interconnect-level dielectric material layer 660. Conductive via structures, which are herein referred to as fifth conductive via structures 662, may be formed in the via-level dielectric material layer 51. Conductive line structures, which are herein referred to sixth conducive line structures 668, may be formed in the line-level dielectric material layer 53. In some embodiments, the fifth conductive via structures 662 and the sixth conductive line structures 668 may be formed as integrated line-and-via structures by performing dual damascene processing steps.

Subsequently, a seventh interconnect-level dielectric material layer 670, sixth conductive via structures 672, and seventh conductive line structures 678 may be formed above the sixth interconnect-level dielectric material layer 660. Optionally, additional seventh interconnect-level dielectric material layers (not shown), additional conductive via structures (not shown), and additional conductive line structures (not shown) may be formed above the seventh interconnect-level dielectric material layer 670. Metal bonding structures, such as metal bonding pads, and a passivation dielectric layer may be formed at the topmost level of the interconnect-level dielectric material layers.

Generally, a capacitor circuit may be formed over the lower-level dielectric material layers (601, 610, 620, 630, 640), which may also be referred to as first dielectric material layers. The capacitor circuit comprises a parallel connection of capacitor-switch assemblies 60. The parallel connection of capacitor-switch assemblies may comprise: a first capacitor-switch assembly 60A that comprises a first series connection of a first capacitor 30A and a first non-Ohmic switching device (48, 12, 46) which has a first threshold voltage and comprises a first primary switch electrode 48, a first secondary switch electrode 46, and a first non-Ohmic switching material portion 12 contacting the first primary switch electrode 48 and the first secondary switch electrode 46, and a second capacitor-switch assembly 60B that comprises a second series connection of a second capacitor 30B and a second non-Ohmic switching device (48, 12, 46) which has a second threshold voltage and comprises a second primary switch electrode 48, a second secondary switch electrode 46, and a second non-Ohmic switching material portion 12 contacting the second primary switch electrode 48 and the second secondary switch electrode 46. According to an aspect of the present disclosure, the second threshold voltage is different from the first threshold voltage. The capacitance of the second capacitor 30B may be the same as, or may be different from, the first capacitor 30A.

Additionally, the parallel connection of capacitor-switch assemblies may comprise: a third capacitor-switch assembly 60C that comprises a third series connection of a third capacitor 30C and a third non-Ohmic switching device (48, 12, 46) which has a third threshold voltage and comprises a third primary switch electrode 48, a third secondary switch electrode 46, and a third non-Ohmic switching material portion 12 contacting the third primary switch electrode 48 and the third secondary switch electrode 46, and optionally at least one additional capacitor-switch assembly (not illustrated) that comprises a respective additional series connection of an additional capacitor 30 and an additional non-Ohmic switching device (48, 12, 46) which has a respective threshold voltage and comprises a respective primary switch electrode 48, a respective secondary switch electrode 46, and a respective non-Ohmic switching material portion 12 contacting the respective primary switch electrode 48 and the respective secondary switch electrode 46. According to an aspect of the present disclosure, the threshold voltages of the non-Ohmic switching devices (48, 12, 46) may be different from one another.

In one embodiment, each primary switch electrode 48 and each secondary switch electrode 46 have top surfaces located within a horizontal plane, and each non-Ohmic switching material portion 12 has a horizontal surface (such as a bottom surface) located within the horizontal plane. In one embodiment, the horizontal surface of each non-Ohmic switching material portion 12 contacts a segment of a top surface of a respective primary switch electrode 48, and contacts a segment of a top surface of a respective secondary switch electrode 46.

In one embodiment, each of the capacitors 30 (such as the first capacitor 30A, the second capacitor 30B, etc.), and each of the non-Ohmic switching devices (48, 12, 560) (such as the first non-Ohmic switching device (48, 12, 56), and the second non-Ohmic switching device (48, 12, 56), etc.) are in contact with a respective one of the dielectric material layers (650, 660). In one embodiment, each of the non-Ohmic switching material portions 12 (such as the first non-Ohmic switching material portion 12, the second non-Ohmic switching material portion 12, etc.) comprises a respective sidewall that contacts a first dielectric material layer (such as a via-level dielectric material layer 51) selected from the dielectric material layers (650, 660).

Figure 3D:
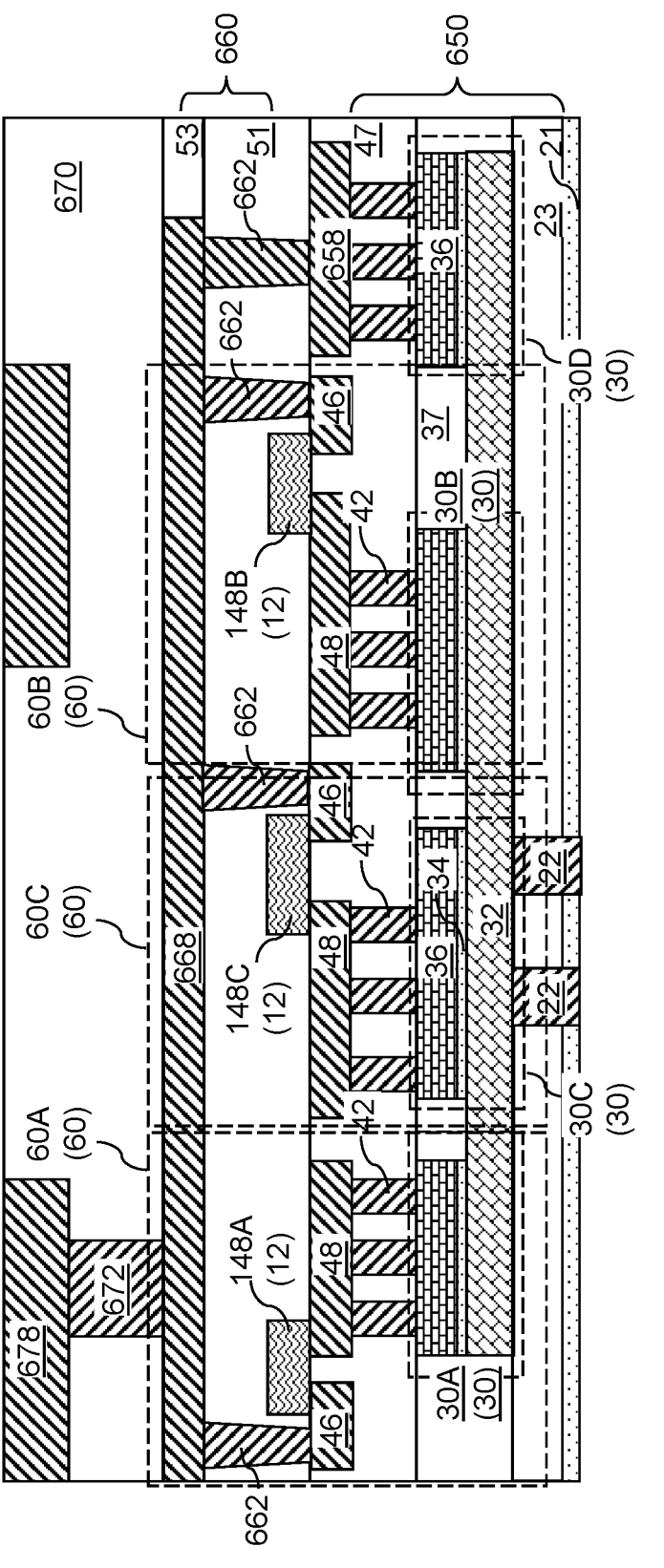
FIG. 3D is a vertical cross-sectional view of an alternative embodiment of the second structure according to an embodiment of the present disclosure.

Referring to FIG. 3D, an alternative embodiment of the second structure according to an embodiment of the present disclosure may be derived from the second exemplary structure illustrated in FIG. 3C by forming an additional capacitor 30D that is connected to the parallel connection of capacitor-switch assemblies illustrated in FIG. 3C in a parallel connection. In this embodiment, a fifth conductive via structure 662 may be provided between a common node of the parallel connection of capacitor-switch assemblies (such as a sixth conductive line structure 668) and a fifth conductive line structure 658 that is electrically connected to the upper capacitor electrode plate 36 of the additional capacitor 30D. The fifth conductive via structure 662 consists of at least one conductive material, and thus, provides a conductive path between the common node of the parallel connection of capacitor-switch assemblies and the upper capacitor electrode plate 36 of the additional capacitor 30D. As such, the additional capacitor 30D is always connected to the parallel connection of capacitor-switch assemblies, and provides a capacitive coupling path between the two end nodes of the parallel connection of capacitor-switch assemblies irrespective of the state of the non-Ohmic switching devices (48, 12, 56).

FIGS. 4A-4D are sequential vertical cross-sectional views of a third structure during formation of a device structure according to an embodiment of the present disclosure.

Figure 4A:
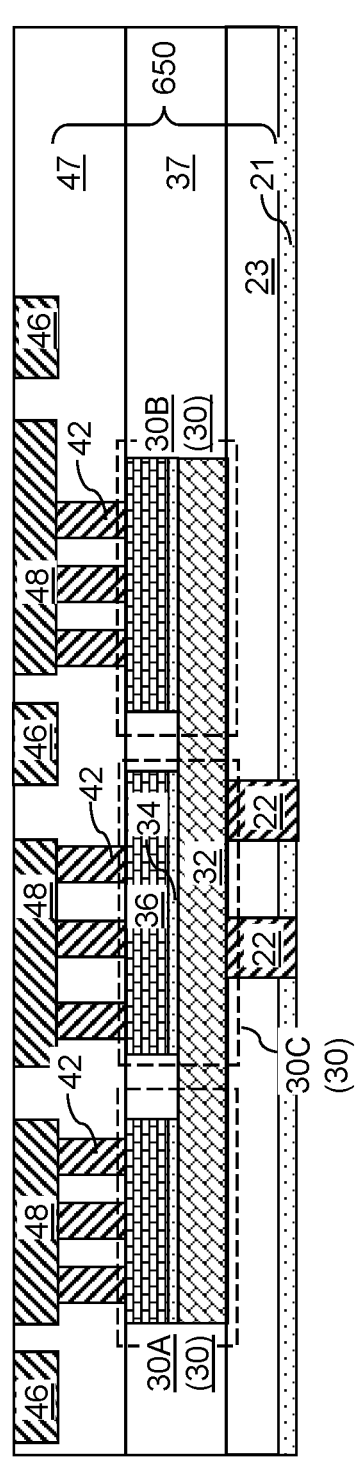
FIGS. 4A-4D are sequential vertical cross-sectional views of a third structure during formation of a device structure according to an embodiment of the present disclosure.

Referring to FIG. 4A, the third structure may be derived from the second exemplary structure illustrated in FIG. 3A by omitting formation of the non-Ohmic switching material layer 148L.

Figure 4B:
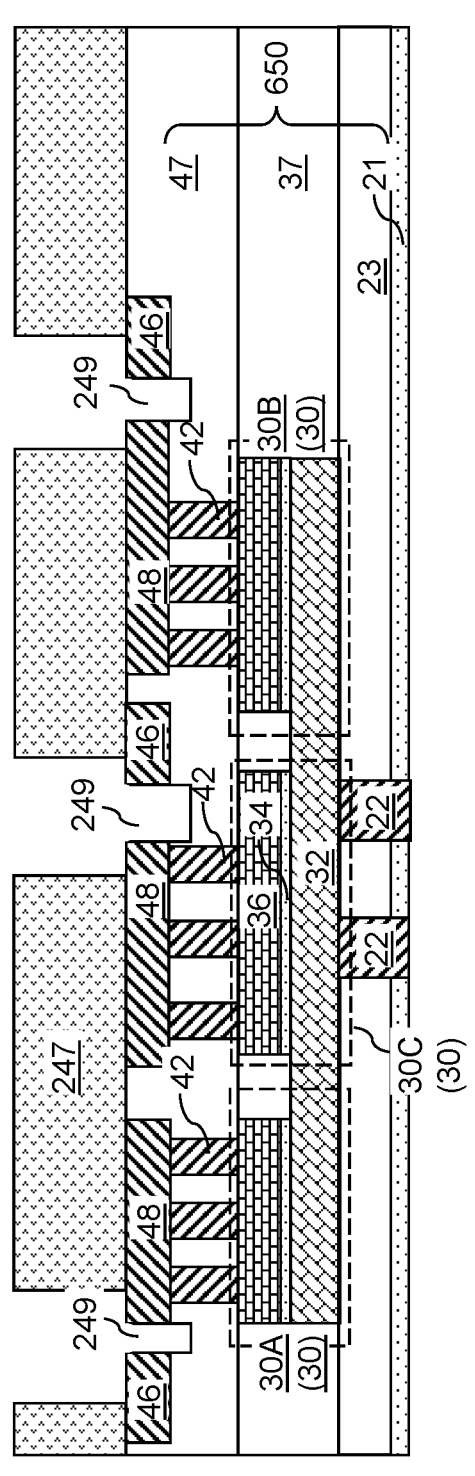

Referring to FIG. 4B, a photoresist layer 247 may be applied over the top surface of the upper-connection-level dielectric layer 47, the primary switch electrodes 48, and the secondary switch electrodes 46, and may be lithographically patterned to form discrete openings that overlie a respective gap between a respective neighboring pair of a primary switch electrode 48 and a secondary switch electrode 46. Generally, the pattern of the openings in the photoresist layer 247 may have the same pattern as the pattern of the plate structures (148A, 148B, 148C) in the second exemplary structure. Portions of the fifth interconnect-level dielectric material layer 650 that are not located between a neighboring pair of a primary switch electrode 48 and a secondary switch electrode 46 are covered by the photoresist layer 247. As discussed above the widths of the gaps between neighboring pairs of a primary switch electrode 48 and a secondary switch electrode 46 may differ for at least two gaps and/or among all gaps.

An etch process may be performed to remove upper portions of the fifth interconnect-level dielectric material layer 650 (such as upper portions of the upper-connection-level dielectric layer 47) that are not masked by the photoresist layer 247. The etch process may comprise an anisotropic etch process (such as a reactive ion etch process) or an isotropic etch process (such as a wet etch process). Via cavities 249 are formed within each volume from which a material of the fifth interconnect-level dielectric material layer 650 is removed. Sidewalls of neighboring pairs of a respective primary switch electrode 48 and a respective secondary switch electrode 46 may be physically exposed around each via cavity 249. The depth of each via cavity 249 may be greater than, less than, or equal to, the height of the primary switch electrodes 48 and the secondary switch electrodes 46. The photoresist layer 247 may be subsequently removed, for example, by ashing.

Figure 4C:
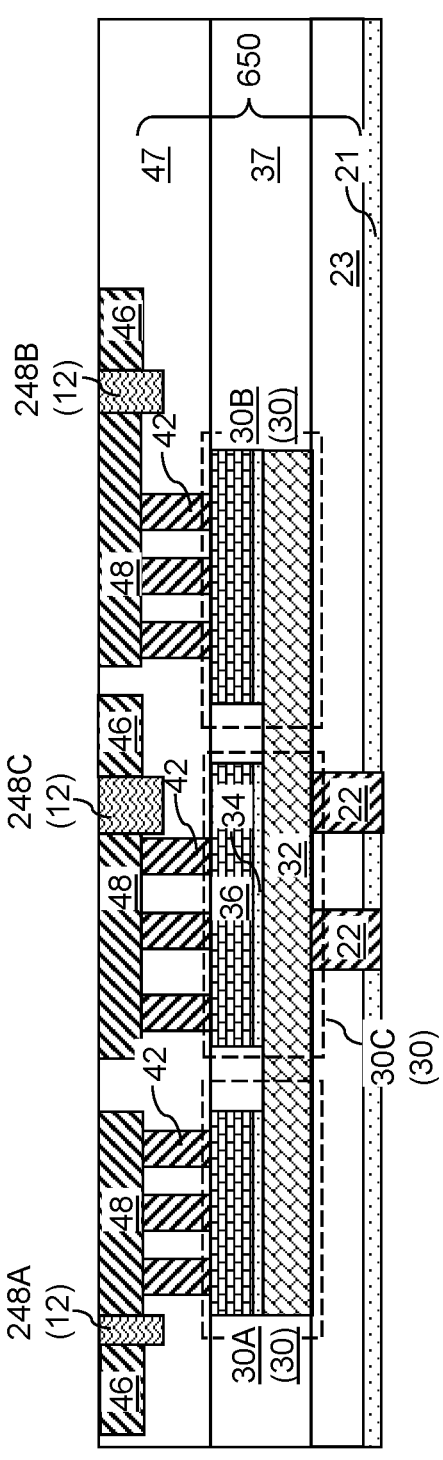

Referring to FIG. 4C, at least one non-Ohmic switching material may be deposited in the via cavities 249, and excess portions of the at least one non-Ohmic switching material may be removed from outside the via cavities 249, i.e., from above the horizontal plane including the top surface of the upper-connection-level dielectric layer 47. The at least one non-Ohmic material used in the third structure may be any of the non-Ohmic materials that may be used for the non-Ohmic switching material portions 12 described with reference to FIG. 2E.

Each remaining portion of the at least one non-Ohmic switching material that fills a respective via cavity 249 constitutes a non-Ohmic switching material portion 12, which is a non-Ohmic switching material via structure (248A, 248B, 248C). In one embodiment, each of the non-Ohmic switching material via structures (248A, 248B, 248C) may have a horizontal top surface located entirely within the horizontal plane including the top surface of the upper-connection-level dielectric layer 47. A non-Ohmic switching material via structure (248A, 248B, 248C) may be formed between neighboring pairs of a primary switch electrode 48 and a secondary switch electrode 46. The non-Ohmic switching material via structure (248A, 248B, 248C) may contact a sidewall of the primary switch electrode 48 and a sidewall of the secondary switch electrode 46.

The non-Ohmic switching material via structures (248A, 248B, 248C) may comprise a first non-Ohmic switching material via structure 248A that is formed on a sidewall of a primary switch electrode 48 that is electrically connected to the upper capacitor plate electrode 36 of the first capacitor 30A and on a sidewall of a secondary switch electrode 46; a second non-Ohmic switching material via structure 248B that is formed on a sidewall of a primary switch electrode 48 that is electrically connected to the upper capacitor plate electrode 36 of the second capacitor 30B and on a sidewall of another secondary switch electrode 46; a third non-Ohmic switching material via structure 248C that is formed on a sidewall of a primary switch electrode 48 that is electrically connected to the upper capacitor plate electrode 36 of the third capacitor 30C and on a sidewall of yet another secondary switch electrode 46, etc. As discussed above, the secondary switch electrodes 46 may be formed as a single continuous conductive structure, or may be subsequently electrically connected among one another by metal interconnect structures to be subsequently formed.

Generally, the lateral dimensions and/or the material compositions of the non-Ohmic switching material via structures (248A, 248B, 248C) may be selected such that the non-Ohmic switching material via structures (248A, 248B, 248C) have different threshold voltages for switching from an off state to an on state.

Figure 4D:
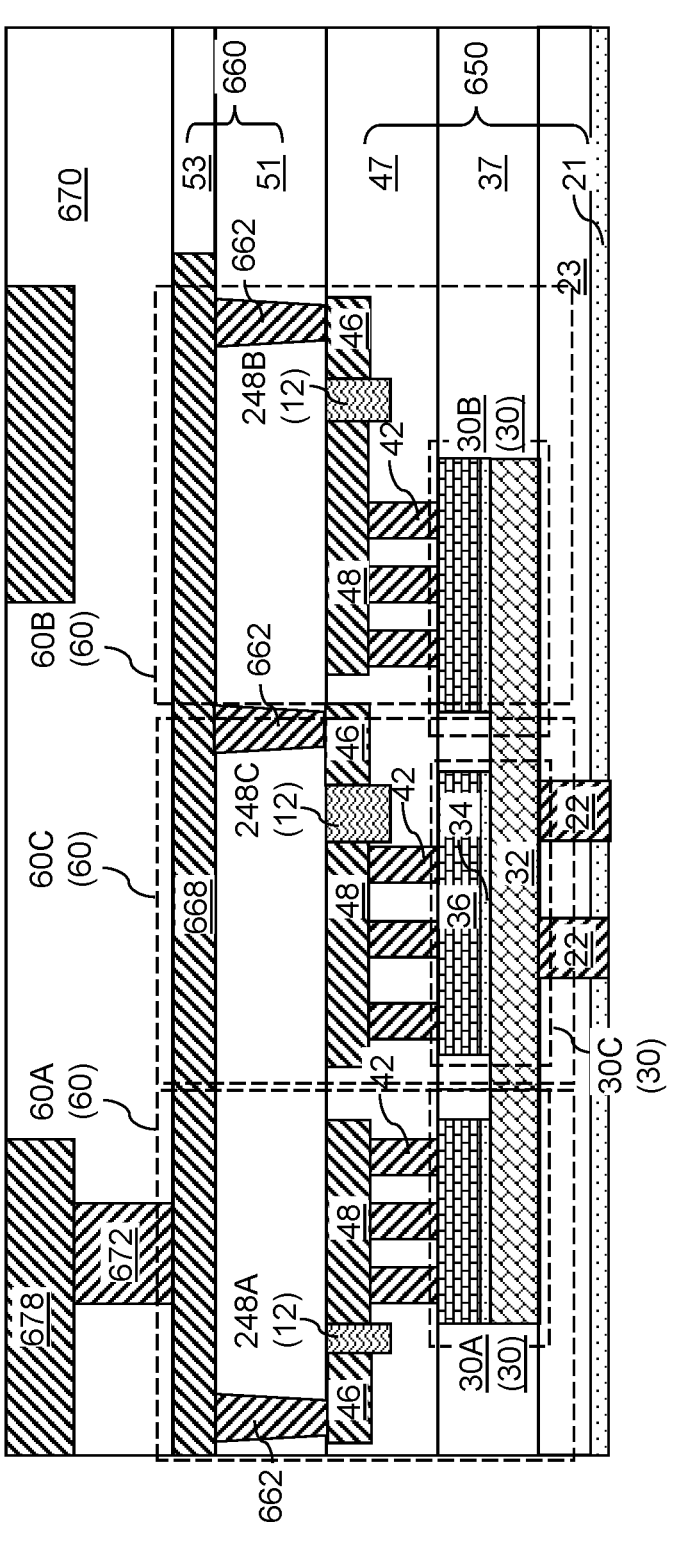

Referring to FIG. 4D, a via-level dielectric material layer 51 and a line-level dielectric material layer 53 may be formed over the non-Ohmic switching material portions 12. The combination of the via-level dielectric material layer 51 and the line-level dielectric material layer 53 is herein referred to as an interconnect-level dielectric layer, or as a sixth interconnect-level dielectric material layer 660. Conductive via structures, which are herein referred to as fifth conductive via structures 662, may be formed in the via-level dielectric material layer 51. Conductive line structures, which are herein referred to sixth conducive line structures 668, may be formed in the line-level dielectric material layer 53. In some embodiments, the fifth conductive via structures 662 and the sixth conductive line structures 668 may be formed as integrated line-and-via structures by performing dual damascene processing steps.

Subsequently, a seventh interconnect-level dielectric material layer 670, sixth conductive via structures 672, and seventh conductive line structures 678 may be formed above the sixth interconnect-level dielectric material layer 660. Optionally, additional seventh interconnect-level dielectric material layers (not shown), additional conductive via structures (not shown), and additional conductive line structures (not shown) may be formed above the seventh interconnect-level dielectric material layer 670. Metal bonding structures, such as metal bonding pads, and a passivation dielectric layer may be formed at the topmost level of the interconnect-level dielectric material layers.

Generally, a capacitor circuit may be formed over the lower-level dielectric material layers (601, 610, 620, 630, 640), which may also be referred to as first dielectric material layers. The capacitor circuit comprises a parallel connection of capacitor-switch assemblies 60. The parallel connection of capacitor-switch assemblies may comprise: a first capacitor-switch assembly 60A that comprises a first series connection of a first capacitor 30A and a first non-Ohmic switching device (48, 12, 46) which has a first threshold voltage and comprises a first primary switch electrode 48, a first secondary switch electrode 46, and a first non-Ohmic switching material portion 12 contacting the first primary switch electrode 48 and the first secondary switch electrode 46, and a second capacitor-switch assembly 60B that comprises a second series connection of a second capacitor 30B and a second non-Ohmic switching device (48, 12, 46) which has a second threshold voltage and comprises a second primary switch electrode 48, a second secondary switch electrode 46, and a second non-Ohmic switching material portion 12 contacting the second primary switch electrode 48 and the second secondary switch electrode 46. According to an aspect of the present disclosure, the second threshold voltage is different from the first threshold voltage. The capacitance of the second capacitor 30B may be the same as, or may be different from, the first capacitor 30A.

Additionally, the parallel connection of capacitor-switch assemblies may comprise: a third capacitor-switch assembly 60C that comprises a third series connection of a third capacitor 30C and a third non-Ohmic switching device (48, 12, 46) which has a third threshold voltage and comprises a third primary switch electrode 48, a third secondary switch electrode 46, and a third non-Ohmic switching material portion 12 contacting the third primary switch electrode 48 and the third secondary switch electrode 46, and optionally at least one additional capacitor-switch assembly (not illustrated) that comprises a respective additional series connection of an additional capacitor 30 and an additional non-Ohmic switching device (48, 12, 46) which has a respective threshold voltage and comprises a respective primary switch electrode 48, a respective secondary switch electrode 46, and a respective non-Ohmic switching material portion 12 contacting the respective primary switch electrode 48 and the respective secondary switch electrode 46. According to an aspect of the present disclosure, the threshold voltages of the non-Ohmic switching devices (48, 12, 46) may be different from one another.

In one embodiment, each primary switch electrode 48 and each secondary switch electrode 46 have top surfaces located within a horizontal plane, and each non-Ohmic switching material portion 12 has a horizontal surface (such as a top surface) located within the horizontal plane. In one embodiment, a first sidewall of each non-Ohmic switching material portion 12 contacts a sidewall of a respective primary switch electrode 48, and a second sidewall of each non-Ohmic switching material portion 12 contacts a sidewall of a respective secondary switch electrode 46.

In one embodiment, each of the capacitors 30 (such as the first capacitor 30A, the second capacitor 30B, etc.), and each of the non-Ohmic switching devices (48, 12, 560) (such as the first non-Ohmic switching device (48, 12, 56), and the second non-Ohmic switching device (48, 12, 56), etc.) are in contact with a respective one of the dielectric material layers (650, 660). In one embodiment, each of the non-Ohmic switching material portions 12 (such as the first non-Ohmic switching material portion 12, the second non-Ohmic switching material portion 12, etc.) comprises a respective sidewall that contacts a first dielectric material layer (such as an upper-connection-level dielectric layer 47) selected from the dielectric material layers (650, 660).

Figure 4E:
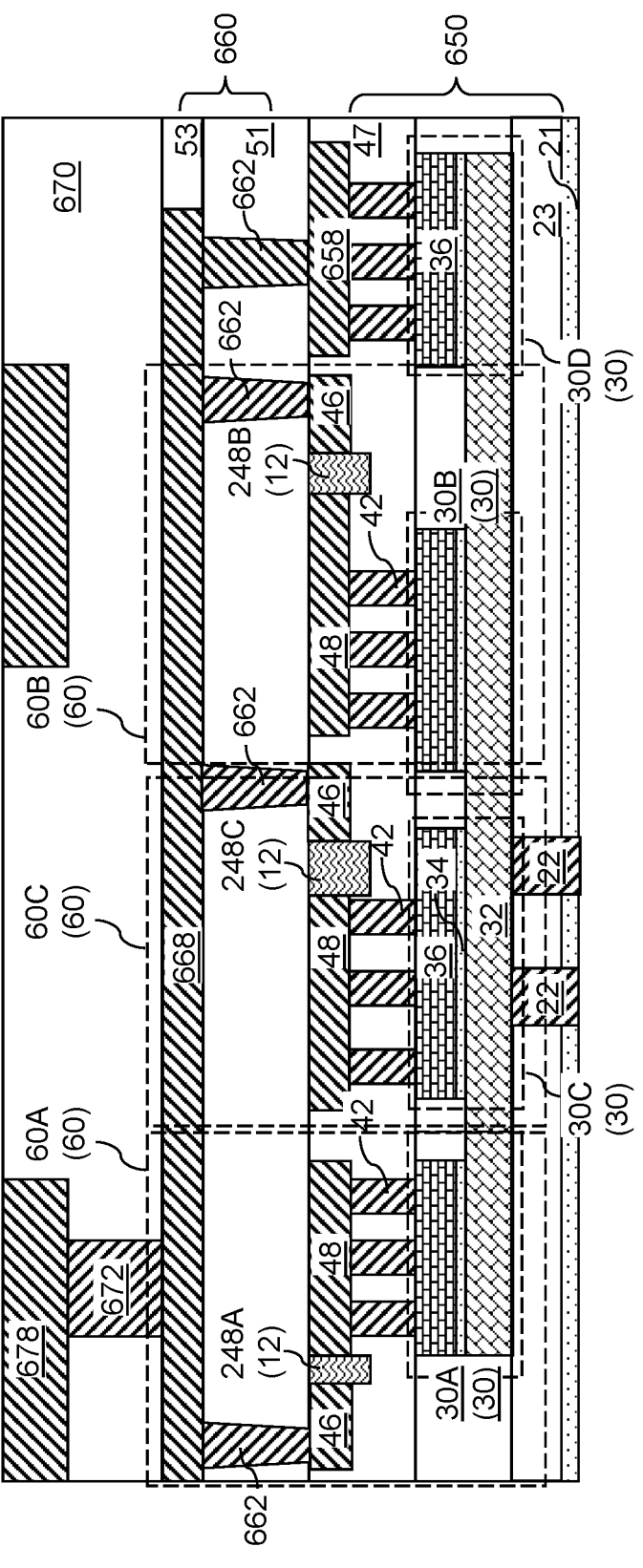
FIG. 4E is a vertical cross-sectional view of an alternative embodiment of the third structure according to an embodiment of the present disclosure.

Referring to FIG. 4E, an alternative embodiment of the third structure according to an embodiment of the present disclosure may be derived from the second exemplary structure illustrated in FIG. 4D by forming an additional capacitor 30D that is connected to the parallel connection of capacitor-switch assemblies illustrated in FIG. 4D in a parallel connection. In this embodiment, a fifth conductive via structure 662 may be provided between a common node of the parallel connection of capacitor-switch assemblies (such as a sixth conductive line structure 668) and a fifth conductive line structure 658 that is electrically connected to the upper capacitor electrode plate 36 of the additional capacitor 30D. The fifth conductive via structure 662 consists of at least one conductive material, and thus, provides a conductive path between the common node of the parallel connection of capacitor-switch assemblies and the upper capacitor electrode plate 36 of the additional capacitor 30D. As such, the additional capacitor 30D is always connected to the parallel connection of capacitor-switch assemblies, and provides a capacitive coupling path between the two end nodes of the parallel connection of capacitor-switch assemblies irrespective of the state of the non-Ohmic switching devices (48, 12, 56).

Figure 5A:
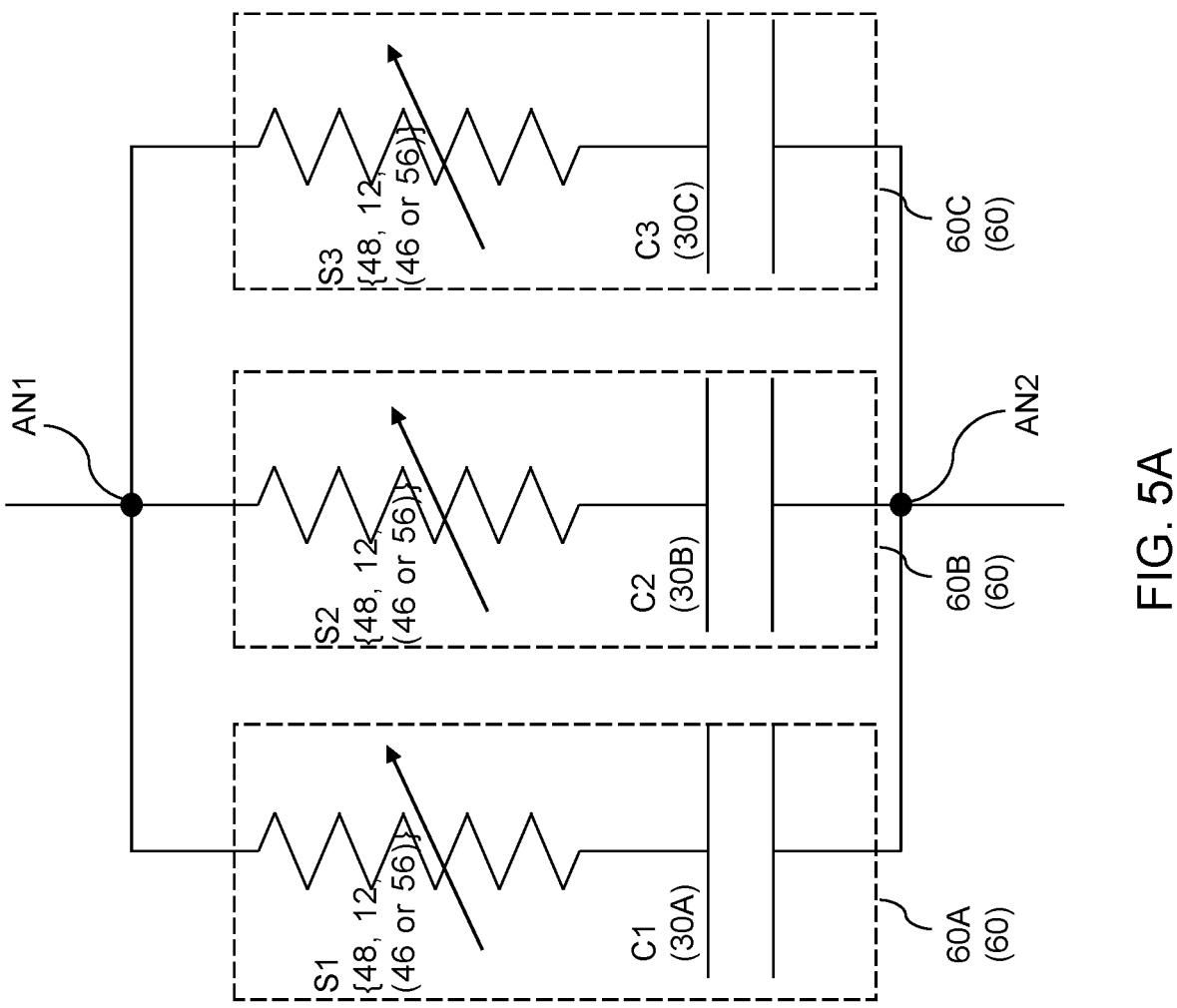
FIG. 5A is a schematic circuit diagram of a first capacitor circuit according to an embodiment of the present disclosure.

Referring to FIG. 5A, a schematic circuit diagram of a first capacitor circuit according to an embodiment of the present disclosure is illustrated. The circuit diagram of FIG. 5A represents the capacitor circuits illustrated in FIGS. 2F, 3C, and 4D. The capacitor circuit comprises a parallel connection of multiple capacitor assemblies 60. Each capacitor-switch assembly (60A, 60B, 60C) comprises a series connection of a switch and a capacitor. For example, a first capacitor-switch assembly 60A comprises a series connection of a first switch S1 and a first capacitor C1, a second capacitor-switch assembly 60B comprises a series connection of a second switch S2 and a second capacitor C2, a third capacitor-switch assembly 60C comprises a series connection of a third switch S3 and a third capacitor C3, etc.

Generally, the parallel connection of capacitor-switch assemblies 60 comprises a first assembly node AN1 at which a first end node of the first capacitor-switch assembly 60A is connected to a first end node of the second capacitor-switch assembly 60B, and comprises a second assembly node AN2 at which a second end node of the first capacitor-switch assembly 60A is connected to a second end node of the second capacitor-switch assembly 60B. A first end node of the third capacitor-switch assembly 60C and a first end node of any additional capacitor-switch assembly (not shown) may be connected to the first assembly node AN1. A second end node of the third capacitor-switch assembly 60C and a second end node of any additional capacitor-switch assembly may be connected to the second assembly node AN2.

The capacitor circuit illustrated in FIG. 5A has negligible capacitance before any of the switches (S1, S2, S3) is turned on by application of a voltage pulse that exceeds the lowest threshold voltage selected from the threshold voltages of the switches (S1, S2, S3). The voltage pulse may be due to transient voltages between the two nodes of the capacitor circuit, i.e., between the first assembly node AN1 and the second assembly node AN2. As the number of turned-on switches (S1, S2, S3) increases, the magnitude of the transient voltage pulses decreases due to the increased capacitance of the capacitor circuit. Given the same level of transient electrical charge pulses during operation of the capacitor circuit of the present disclosure, the staggered arrangement of the threshold voltages of the switches (S1, S2, S3) induces self-limiting turn-on mechanism. In other words, switches having higher threshold voltages are less likely to turn on as the total number of turned-on switches increases and the total capacitance of the capacitor circuit increases. Thus, the capacitance of the capacitor circuit of FIG. 5A may converge to a preset value during operation, and thus, the capacitor circuit of FIG. 5A may provide self-converging capacitance that compensates for deviations in process parameters during manufacturing processes.

Figure 5B:
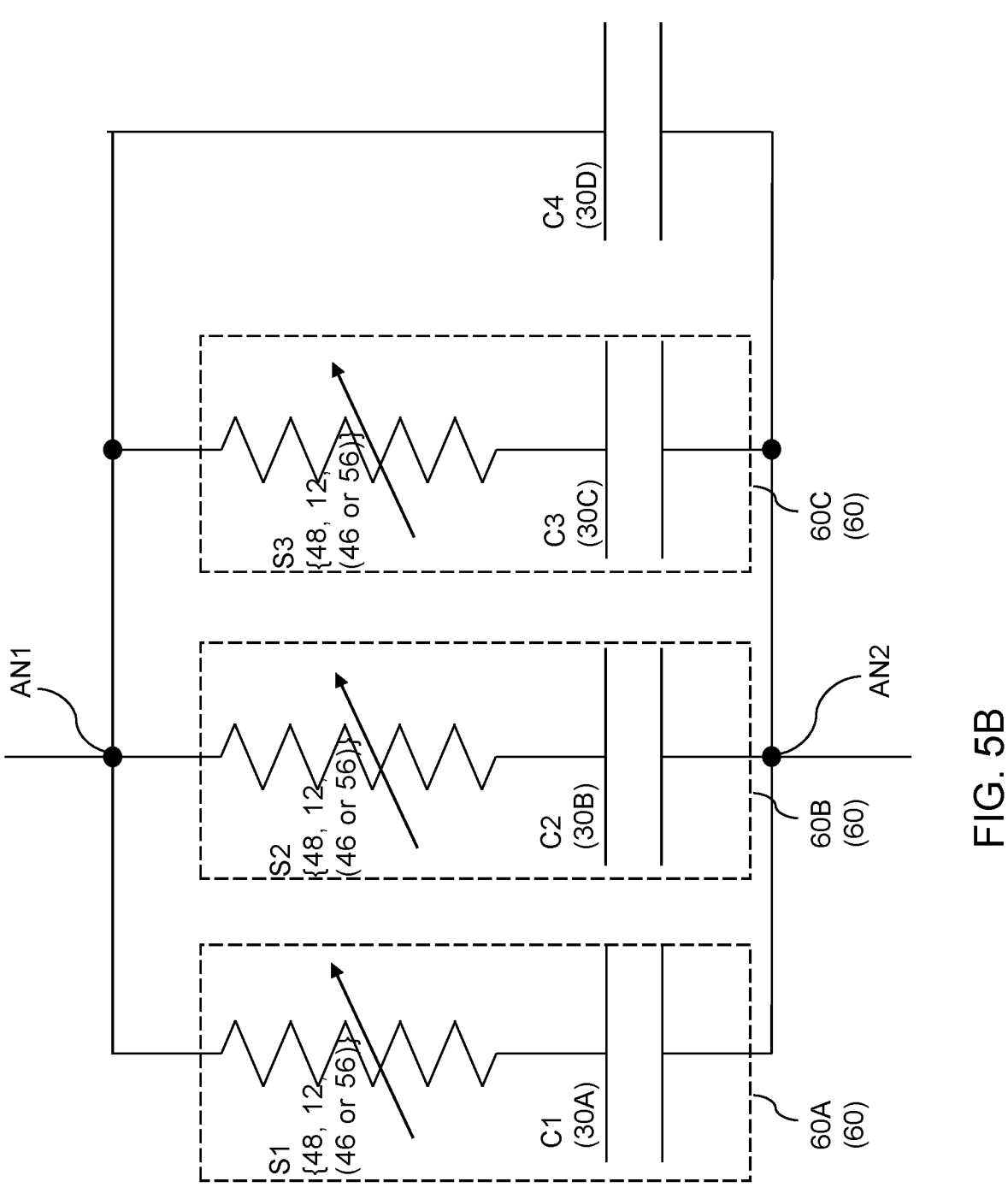
FIG. 5B is a schematic circuit diagram of a second capacitor circuit according to an embodiment of the present disclosure.

Referring to FIG. 5B, a schematic circuit diagram of a second exemplary capacitor circuit according to an embodi-ment of the present disclosure is illustrated. The circuit diagram of FIG. 5B represents the capacitor circuits illustrated in FIGS. 2G, 3D, and 4F. The circuit diagram of FIG. 5B may be derived from the circuit diagram of FIG. 5A by connecting two end nodes of a capacitor, such as a fourth capacitor C4 (which represents the fourth capacitor 30D), to the first assembly node AN1 and to the second assembly node AN2, respectively. The addition of the additional capacitor (such as the fourth capacitor C4) shifts the base capacitance of the capacitor circuit shifts from an insignificantly small capacitance (as provided in the capacitor circuit illustrated in FIG. 5C) to a finite capacitance value, which is the capacitance value of the additional capacitor. The capacitor circuit of FIG. 5B may also provide self-converging capacitance that compensates for deviations in process parameters during manufacturing processes.

In one embodiment, the additional capacitor (such as the fourth capacitor C4) may comprise a metal-insulator-metal (MIM) capacitor having a first capacitor node and a second capacitor node; the first capacitor node is electrically connected to the first assembly node AN1; and the second capacitor node is electrically connected to the second assembly node AN2.

Figure 6:
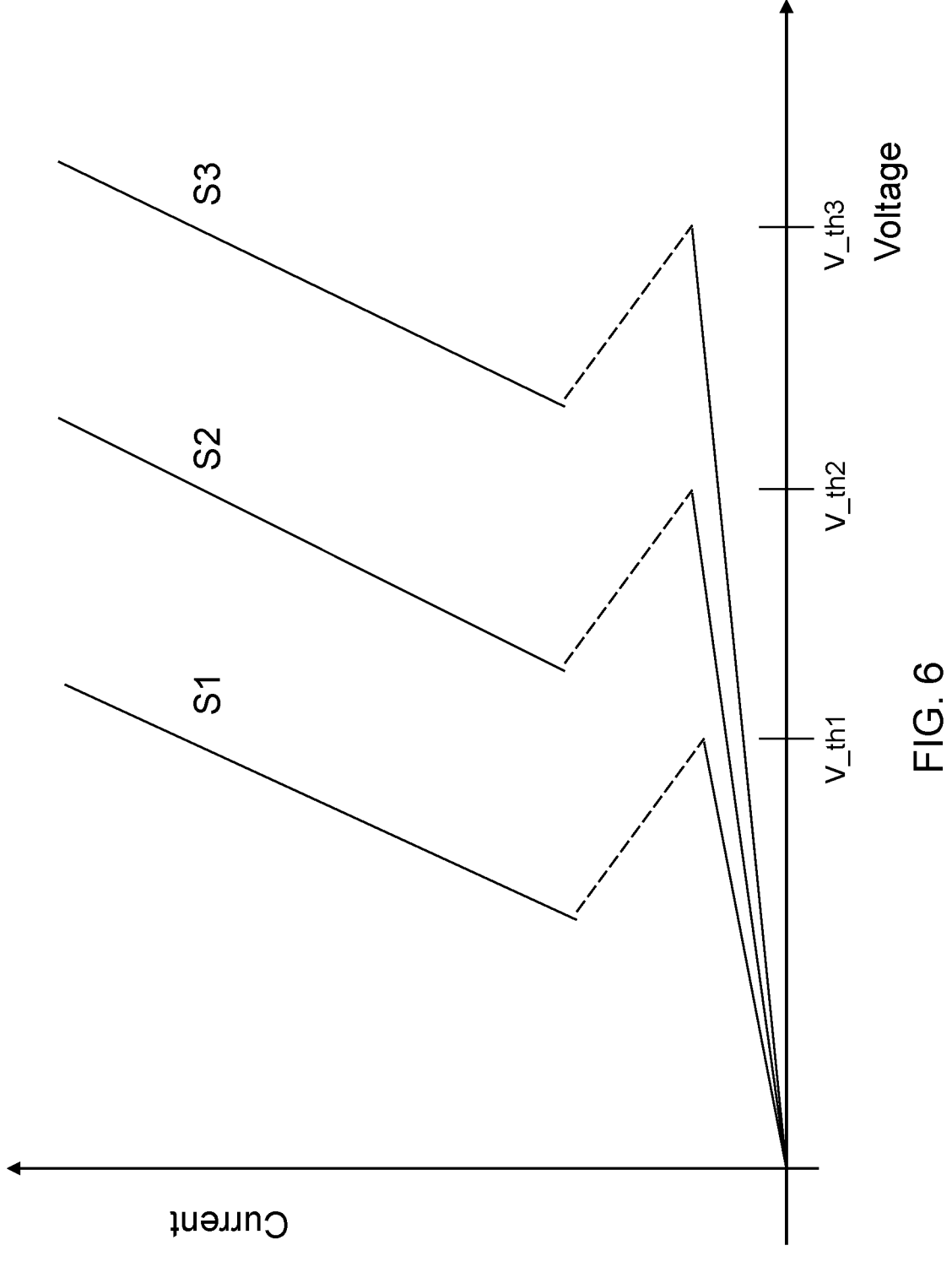
FIG. 6 is graph illustrating current-voltage characteristics of non-Ohmic switching devices of the present disclosure.

Referring to FIG. 6, a graph illustrates current-voltage characteristics of non-Ohmic switching devices {48, 12, (46 or 56)} of the present disclosure, which function as the switches (S1, S2, S3) in the capacitor circuits of FIGS. 5A and 5B. Generally, non-Ohmic switching devices {48, 12, (46 or 56)} behave as a high resistance resistor up to a respective threshold voltage (V_th1, V_th2, V_th3). Once the magnitude of the applied external voltage exceeds the respective threshold voltage (V_th1, V_th2, V_th3), the non-Ohmic switching devices {48, 12, (46 or 56)} transition into an on-state, i.e., a low resistance state, which provides a high conductivity and effectively functions as a conductor.

Figures 7A, 7B:
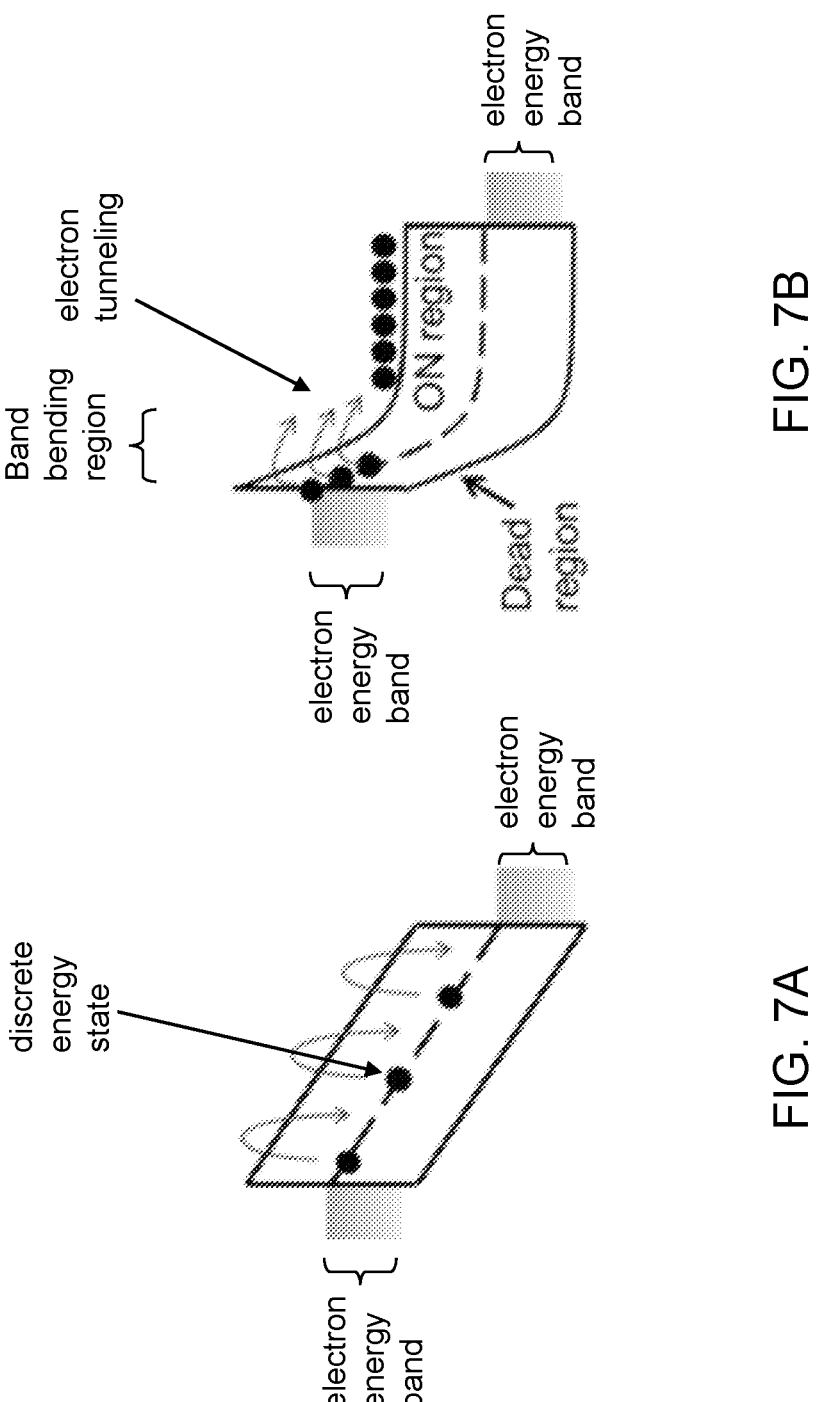
FIG. 7A is a schematic band diagram of a non-Ohmic switching device of the present disclosure in an off state.
FIG. 7B is a schematic band diagram of a non-Ohmic switching device of the present disclosure in an on state.

Various mechanisms may be used for the transition between the high resistance state and the low resistance state of the non-Ohmic switching devices {48, 12, (46 or 56)}. The present disclosure is not limited by any particular operating mechanism of a non-Ohmic switching material. For illustrative purposes, FIGS. 7A and 7B of the instant application provides an example of such a transition mechanism. In FIG. 7A, a band diagram of a non-Ohmic switching material is shown under a low electric field bias condition. Charge carrier transport occurs through localized discrete states within the non-Ohmic switching material, and thus, the conductivity of the non-Ohmic switching material is low in the high resistivity state. In FIG. 7B, a band diagram of the non-Ohmic switching material is shown under a high electric field bias condition. The high electric field induces band bending, and allows charge tunneling. Thus, the conductivity of the non-Ohmic switching material is high in the low resistivity state.

Referring to FIG. 8, general processing steps for manufacturing a device structure according to an embodiment of the present disclosure are illustrated.

Referring to step 810 and FIG. 1A, semiconductor devices 701 may be formed on a top surface of a semiconductor substrate 8.

Referring to step 820 and FIG. 1A, first dielectric material layers (601, 610, 620, 630, 640) and first metal interconnect structures (612, 618, 622, 628, 632, 638, 642, 648) are formed over the semiconductor device 701. The first metal interconnect structures (612, 618, 622, 628, 632, 638, 642, 648) are electrically connected to a respective one of the semiconductor devices 701.

Referring to step 830 and FIGS. 1B-5B, a capacitor circuit may be formed over the first dielectric material layers (601, 610, 620, 630, 640). The capacitor circuit comprises a parallel connection of capacitor-switch assemblies 60. The parallel connection of capacitor-switch assemblies 60 comprises: a first capacitor-switch assembly 60A that comprises a first series connection of a first capacitor 30A and a first non-Ohmic switching device {48, 12, (46 or 56)} which has a first threshold voltage and comprises a first primary switch electrode 48, a first secondary switch electrode (46 or 56), and a first non-Ohmic switching material portion 12 contacting the first primary switch electrode 48 and the first secondary switch electrode (46 or 56), and a second capacitor-switch assembly 60B that comprises a second series connection of a second capacitor 30B and a second non-Ohmic switching device {48, 12, (46 or 56)} which has a second threshold voltage and comprises a second primary switch electrode 48, a second secondary switch electrode (46 or 56), and a second non-Ohmic switching material portion 12 contacting the second primary switch electrode 48 and the second secondary switch electrode (46 or 56), wherein the second threshold voltage is different from the first threshold voltage.

Referring to all drawings and according to various embodiments of the present disclosure, a device structure is provided, which comprises a parallel connection of capacitor-switch assemblies 60 located over a substrate 8. The capacitor-switch assemblies 60 comprise: a first capacitor-switch assembly 60A that comprises a first series connection of a first capacitor 30A and a first non-Ohmic switching device {48, 12, (46 or 56)}, which has a first threshold voltage and comprises a first primary switch electrode 48, a first secondary switch electrode (46 or 56), and a first non-Ohmic switching material portion 12 contacting the first primary switch electrode 48 and the first secondary switch electrode (46 or 56); and a second capacitor-switch assembly 60B that comprises a second series connection of a second capacitor 30B and a second non-Ohmic switching device {48, 12, (46 or 56)}, which has a second threshold voltage and comprises a second primary switch electrode 48, a second secondary switch electrode (46 or 56), and a second non-Ohmic switching material portion 12 contacting the second primary switch electrode 48 and the second secondary switch electrode (46 or 56), wherein the second threshold voltage is different from the first threshold voltage.

In one embodiment, the device structure comprises dielectric material layers (650, 660) located over the substrate 8, wherein each of the first capacitor 30A, the second capacitor 30B, the first non-Ohmic switching device {48, 12, (46 or 56)}, and the second non-Ohmic switching device {48, 12, (46 or 56)} are in contact with a respective one of the dielectric material layers (650, 660).

In one embodiment, each of the first non-Ohmic switching material portion 12 and the second non-Ohmic switching material portion 12 comprises a respective sidewall that contacts a first dielectric material layer selected from the dielectric material layers (650, 660).

In one embodiment, the first primary switch electrode 48 contacts a bottom surface of the first non-Ohmic switching material portion 12; and the first secondary switch electrode 56 contacts a top surface of the first non-Ohmic switching material portion 12.

In one embodiment, the first primary switch electrode 48 and the first secondary switch electrode (46 or 56) have top surfaces located within a horizontal plane; and the first non-Ohmic switching material portion 12 has a horizontal surface located within the horizontal plane.

In one embodiment, the horizontal surface of the first non-Ohmic switching material portion 12 contacts a segment of a top surface of the first primary switch electrode 48, and contacts a segment of a top surface of the first secondary switch electrode 46.

In one embodiment, the first non-Ohmic switching material portion 12 contacts a segment of a sidewall of the first primary switch electrode 48, and contacts a sidewall of the first secondary switch electrode 46.

In one embodiment, each of the first non-Ohmic switching material portion 12 and the second non-Ohmic switching material portion 12 comprises a respective ovonic threshold material or a respective phase change memory material.

In one embodiment, each of the first capacitor 30A and the second capacitor 30B comprises a respective metal-insulator-metal (MIM) capacitor that includes a respective lower capacitor electrode plate 32 and a respective upper capacitor electrode plate 36.

In one embodiment, the lower capacitor electrode plates 32 of the first capacitor 30A and the second capacitor 30B are merged as a single conductive electrode plate; the upper capacitor electrode plate 36 of the first capacitor 30A and the upper capacitor electrode plate 36 of the second capacitor 30B are comprised as discrete conductive electrode plates that do not contact each other; the upper capacitor electrode plate 36 of the first capacitor 30A is contacted by at least one first conductive via structure 42 electrically connected to the first primary switch electrode 48; and the upper capacitor electrode plate 36 of the second capacitor 30B is contacted by at least one second conductive via structure 42 electrically connected to the second primary switch electrode 48.

In one embodiment, the parallel connection of capacitor-switch assemblies 60 comprises a first assembly node AN1 at which a first end node of the first capacitor-switch assembly 60A is connected to a first end node of the second capacitor-switch assembly 60B, and comprises a second assembly node AN2 at which a second end node of the second capacitor-switch assembly 60B is connected to a second end node of the second capacitor-switch assembly 60B; the first assembly node AN1 is electrically connected to a power supply node; the device structure comprises semiconductor devices located on the substrate 8; and the second assembly node AN2 is electrically connected to at least one node of the semiconductor devices.

In one embodiment, the parallel connection of capacitor-switch assemblies 60 comprises a first assembly node AN1 at which a first end node of the first capacitor-switch assembly 60A is connected to a first end node of the second capacitor-switch assembly 60B, and comprises a second assembly node AN2 at which a second end node of the second capacitor-switch assembly 60B is connected to a second end node of the second capacitor-switch assembly 60B; the device structure further comprises a metal-insulator-metal (MIM) capacitor having a first capacitor 30A node and a second capacitor 30B node; the first capacitor 30A node is electrically connected to the first assembly node AN1; and the second capacitor 30B node is electrically connected to the second assembly node AN2.

According to another aspect of the present disclosure, a device structure is provided, which comprises: semiconductor devices 701 located on a top surface of a semiconductor substrate 8; first dielectric material layers (601, 610, 620, 630, 640) located over the semiconductor devices; first metal interconnect structures (612, 618, 622, 628, 631, 638, 642, 648) located in the first dielectric material layers (601, 610, 620, 630, 640) and electrically connected to a respective one of the semiconductor devices 701; and a capacitor circuit located over the first dielectric material layers (601, 610, 620, 630, 640) and comprising a parallel connection of capacitor-switch assemblies 60, which comprises: a first capacitor-switch assembly 60A that comprises a first series connection of a first capacitor 30A and a first non-Ohmic switching device {48, 12, (46 or 56)}, which has a first threshold voltage and comprises a first primary switch electrode 48, a first secondary switch electrode (46 or 56), and a first non-Ohmic switching material portion 12 contacting the first primary switch electrode 48 and the first secondary switch electrode (46 or 56), and a second capacitor-switch assembly 60B that comprises a second series connection of a second capacitor 30B and a second non-Ohmic switching device {48, 12, (46 or 56)}, which has a second threshold voltage and comprises a second primary switch electrode 48, a second secondary switch electrode (46 or 56), and a second non-Ohmic switching material portion 12 contacting the second primary switch electrode 48 and the second secondary switch electrode (46 or 56), wherein the second threshold voltage is different from the first threshold voltage.

In one embodiment, each of the first non-Ohmic switching material portion 12 and the second non-Ohmic switching material portion 12 comprises a respective ovonic threshold material or a respective phase change memory material.

In one embodiment, the device structure comprises second dielectric material layers (650, 660) overlying the first dielectric material layers (601, 610, 620, 630, 640) and laterally surrounding the first capacitor-switch assembly 60A and the second capacitor-switch assembly 60B, wherein each of the first non-Ohmic switching material portion 12 and the second non-Ohmic switching material portion 12 comprises a respective sidewall that contacts one of the second dielectric material layers (650, 660).

The various embodiments of the present disclosure may be used to provide a capacitor circuit that provides a capacitance at a predetermined capacitance level without using any actively controlled switches. The non-Ohmic switching devices of the present disclosure are passive, i.e., does not utilize any other semiconductor device for a turn-on operation or for a turn-off operation. The passive non-Ohmic switching devices turn on sequentially as the magnitude of the transient voltage spike increases. The increased capacitance of the capacitor circuit of the present disclosure reduces the magnitude of subsequent transient voltage spikes. After a few rounds of passive turn-ons and passive turn-offs, the capacitor circuit of the present disclosure may operate in a steady state mode in which the capacitance is at an optimal level. Thus, a suitable level of capacitance may be provided while avoiding excessively high capacitance without using any active switching devices such as field effect transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a parallel connection of capacitor-switch assemblies located over a substrate, wherein the capacitor-switch assemblies comprise:
    a first capacitor-switch assembly that comprises a first series connection of a first capacitor and a first non-Ohmic switching device, which has a first threshold voltage and comprises a first primary switch electrode, a first secondary switch electrode, and a first non-Ohmic switching material portion contacting the first primary switch electrode and the first secondary switch electrode; and
    a second capacitor-switch assembly that comprises a second series connection of a second capacitor and a second non-Ohmic switching device, which has a second threshold voltage and comprises a second primary switch electrode, a second secondary switch electrode, and a second non-Ohmic switching material portion contacting the second primary switch electrode and the second secondary switch electrode, wherein:
        the second threshold voltage is different from the first threshold voltage;
        each of the first capacitor and the second capacitor comprises a respective node dielectric and a respective upper capacitor electrode plate contacting a top surface of the respective node dielectric;
        the node dielectrics of the first capacitor and the second capacitor are discrete node dielectrics that do not contact each other and are laterally spaced apart from each other;
        the first capacitor and the second capacitor comprise a continuous lower capacitor electrode layer that continuously extends underneath entire areas of the node dielectrics of the first capacitor and the second capacitor, and is a lower capacitor electrode for both the first capacitor and the second capacitor; and
        the secondary switch electrodes are interconnected to each other through a contiguous set of metal interconnect structures.

2. The device structure of claim 1, wherein each of the first capacitor and the second capacitor comprises a respective metal-insulator-metal (MIM) capacitor that includes a respective lower capacitor electrode plate and a respective upper capacitor electrode plate.

3. The device structure of claim 2, wherein:
    the lower capacitor electrode plates of the first capacitor and the second capacitor are merged as a single conductive electrode plate;
    the upper capacitor electrode plate of the first capacitor and the upper capacitor electrode plate of the second capacitor are comprised as discrete conductive electrode plates that do not contact each other;
    the upper capacitor electrode plate of the first capacitor is contacted by at least one first conductive via structure electrically connected to the first primary switch electrode; and
    the upper capacitor electrode plate of the second capacitor is contacted by at least one second conductive via structure electrically connected to the second primary switch electrode.

4. The device structure of claim 1, wherein:
    the parallel connection of capacitor-switch assemblies comprises a first assembly node at which a first end node of the first capacitor-switch assembly is connected to a first end node of the second capacitor-switch assembly, and comprises a second assembly node at which a second end node of the first capacitor-switch assembly is connected to a second end node of the second capacitor-switch assembly;

the first assembly node is electrically connected to a power supply node;

the device structure comprises semiconductor devices located on the substrate; and the second assembly node is electrically connected to at least one node of the semiconductor devices.

5. The device structure of claim 1, wherein:

the parallel connection of capacitor-switch assemblies comprises a first assembly node at which a first end node of the first capacitor-switch assembly is connected to a first end node of the second capacitor-switch assembly, and comprises a second assembly node at which a second end node of the first capacitor-switch assembly is connected to a second end node of the second capacitor-switch assembly;

the device structure further comprises a metal-insulator-metal (MIM) capacitor having a first capacitor node and a second capacitor node;

the first capacitor node is electrically connected to the first assembly node; and the second capacitor node is electrically connected to the second assembly node.

6. The device structure of claim 1, wherein the continuous lower capacitor electrode layer has an area that is greater than a sum of an area of the upper capacitor electrode plate of the first capacitor and an area of the upper capacitor electrode plate of the second capacitor.

7. The device structure of claim 1, further comprising:

first top capacitor contact via structures contacting the upper capacitor electrode plate of the first capacitor and the first primary switch electrode; and second top capacitor contact via structures contacting the upper capacitor electrode plate of the second capacitor and the second primary switch electrode.

8. The device structure of claim 1, wherein:

the parallel connection of capacitor-switch assemblies comprises a first assembly node and a second assembly node;

the first assembly node comprises the first secondary switch electrode, the second secondary switch electrode, and the contiguous set of metal interconnect structures; and the second assembly node comprises the continuous lower capacitor electrode layer.

9. The device structure of claim 8, wherein:

the node dielectric of the first capacitor is laterally spaced from the node dielectric of the second capacitor;

the node dielectric of the first capacitor contacts an entirety of a bottom surface of the upper capacitor electrode plate of the first capacitor; and the node dielectric of the second capacitor contacts an entirety of a bottom surface of the upper capacitor electrode plate of the second capacitor.

10. The device structure of claim 1, wherein:

top surfaces of the first primary switch electrode, the first secondary switch electrode, the second primary switch electrode, and the second secondary switch electrode are located within a horizontal plane including a top surface of a dielectric material layer; and the first primary switch electrode, the first secondary switch electrode, the second primary switch electrode, and the second secondary switch electrode have a same material composition and a same thickness.

11. The device structure of claim 10, wherein a top surface of the first non-Ohmic switching material portion and a top surface of the second non-Ohmic switching material portion are located within the horizontal plane.

12. The device structure of claim 10, wherein the first non-Ohmic switching material portion and the second non-Ohmic switching material portion have a greater vertical extent than the first primary switch electrode, the first secondary switch electrode, the second primary switch electrode, and the second secondary switch electrode.

13. The device structure of claim 1, wherein:

the first non-Ohmic switching material portion contacts a sidewall of the first primary switch electrode and a sidewall of the first secondary switch electrode; and the second non-Ohmic switching material portion contacts a sidewall of the second primary switch electrode and a sidewall of the second secondary switch electrode.

14. A device structure comprising:

semiconductor devices located on a top surface of a semiconductor substrate;

first dielectric material layers located over the semiconductor devices;

first metal interconnect structures located in the first dielectric material layers and electrically connected to a respective one of the semiconductor devices; and a capacitor circuit located over the first dielectric material layers and comprising a parallel connection of capacitor-switch assemblies which comprises:

a first capacitor-switch assembly that comprises a first series connection of a first capacitor and a first two-terminal non-Ohmic switching device, which has a first threshold voltage and comprises a first primary switch electrode, a first secondary switch electrode, and a first non-Ohmic switching material portion contacting the first primary switch electrode and the first secondary switch electrode, and a second capacitor-switch assembly that comprises a second series connection of a second capacitor and a second two-terminal non-Ohmic switching device, which has a second threshold voltage and comprises a second primary switch electrode, a second secondary switch electrode, and a second non-Ohmic switching material portion contacting the second primary switch electrode and the second secondary switch electrode, wherein:

the second threshold voltage is different from the first threshold voltage;

the upper capacitor electrode plates, the primary switch electrodes, the secondary switch electrodes, and the non-Ohmic switching material portions of the first two-terminal non-Ohmic switching device and the second two-terminal non-Ohmic switch device are embedded in, or located on, second dielectric material layers that overlie the first dielectric material layers;

a first node dielectric of the first capacitor and a second node dielectric of the second capacitor are discrete node dielectrics that do not contact each other and are laterally spaced apart from each other;

the primary switch electrodes and the secondary switch electrodes comprise a subset of second metal interconnect structures embedded in the second dielectric material layers; and each of the non-Ohmic switching material portions is in contact with a respective one of the primary switch electrodes and a respective one of the secondary switch electrodes.

15. A device structure comprising a parallel connection of capacitor-switch assemblies located over a substrate, wherein the capacitor-switch assemblies comprise:

a first capacitor-switch assembly that comprises a first series connection of a first capacitor and a first non-Ohmic switching device, which has a first threshold voltage and comprises a first primary switch electrode, a first secondary switch electrode, and a first non-Ohmic switching material portion contacting the first primary switch electrode and the first secondary switch electrode; and a second capacitor-switch assembly that comprises a second series connection of a second capacitor and a second non-Ohmic switching device, which has a second threshold voltage different from the first threshold voltage and comprises a second primary switch electrode, a second secondary switch electrode, and a second non-Ohmic switching material portion contacting the second primary switch electrode and the second secondary switch electrode, wherein:

the parallel connection of capacitor-switch assemblies comprises a first assembly node and a second assembly node;

the first assembly node comprises a contiguous set of metal interconnect structures which includes the first secondary switch electrode, the second secondary switch electrode, and at least one additional metal interconnect structure providing an electrically conductive path between the first secondary switch electrode and the second secondary switch electrode;

the second assembly node comprises a continuous lower capacitor electrode layer which is a common lower capacitor electrode plate of the first capacitor and the second capacitor; and the first node dielectric of the first capacitor and the second node dielectric of the second capacitor are discrete node dielectrics that do not contact each other and are laterally spaced apart from each other.

16. The device structure of claim 15, wherein each of the first capacitor and the second capacitor comprises a respective metal-insulator-metal (MIM) capacitor that includes a respective lower capacitor electrode plate comprising at least one first metallic material such as a conductive metallic nitride, a respective node dielectric comprising silicon nitride or a dielectric metal oxide, and a respective upper capacitor electrode plate comprising at least one second metallic material such as a conductive metallic nitride.

17. The device structure of claim 16, wherein:

the first primary switch electrode and the first secondary switch electrode have top surfaces located within a horizontal plane; the first non-Ohmic switching material portion has a horizontal surface located within the horizontal plane, contacts a segment of a sidewall of the first primary switch electrode, and contacts a sidewall of the first secondary switch electrode;

the lower capacitor electrode plates of the first capacitor and the second capacitor are merged as a single conductive electrode plate; and the upper capacitor electrode plate of the first capacitor and the upper capacitor electrode plate of the second capacitor comprise discrete conductive electrode plates that do not contact each other.

18. The device structure of claim 15, further comprising a metal-insulator-metal (MIM) capacitor having a first capacitor node electrically connected to a first assembly node of the parallel connection and a second capacitor node electrically connected to a second assembly node of the parallel connection, wherein:

the parallel connection of capacitor-switch assemblies comprises the first assembly node at which a first end node of the first capacitor-switch assembly is connected to a first end node of the second capacitor-switch assembly, and comprises the second assembly node at which a second end node of the first capacitor-switch assembly is connected to a second end node of the second capacitor-switch assembly;

the first assembly node is electrically connected to a power supply node;

the device structure comprises semiconductor devices located on the substrate; and the second assembly node is electrically connected to at least one node of the semiconductor devices.

19. The device structure of claim 15, wherein the parallel connection of capacitor-switch assemblies comprises a first assembly node that is electrically connected to a power supply node and a second assembly node that is electrically connected to at least one node of semiconductor devices.

20. The device structure of claim 15, wherein:

the first primary switch electrode is electrically connected to the first upper capacitor electrode plate; and the second primary switch electrode is electrically connected to the second upper capacitor electrode plate.

* * * * *